United States Patent
Mallik et al.

(10) Patent No.: US 12,469,801 B2
(45) Date of Patent: Nov. 11, 2025

(54) MOISTURE SEAL COATING OF HYBRID BONDED STACKED DIE PACKAGE ASSEMBLY

(71) Applicant: Intel Corporation, Santa Clara, CA (US)

(72) Inventors: Debendra Mallik, Chandler, AZ (US); Mohammad Enamul Kabir, Portland, OR (US); Nitin Deshpande, Chandler, AZ (US); Omkar Karhade, Chandler, AZ (US); Arnab Sarkar, Chandler, AZ (US); Sairam Agraharam, Chandler, AZ (US); Christopher Pelto, Beaverton, OR (US); Gwang-Soo Kim, Portland, OR (US); Ravindranath Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 17/554,471

(22) Filed: Dec. 17, 2021

(65) Prior Publication Data
US 2023/0197637 A1   Jun. 22, 2023

(51) Int. Cl.
*H01L 23/00* (2006.01)
*H01L 21/20* (2006.01)
*H01L 21/447* (2006.01)
*H01L 25/065* (2023.01)

(52) U.S. Cl.
CPC ........ *H01L 23/564* (2013.01); *H01L 25/0655* (2013.01); *H01L 21/2007* (2013.01); *H01L 21/447* (2013.01)

(58) Field of Classification Search
CPC ............... H01L 23/564; H01L 25/0655; H01L 21/2007; H01L 21/447; H01L 2224/00
See application file for complete search history.

(56) References Cited

U.S. PATENT DOCUMENTS

| | | | | |
|---|---|---|---|---|
| 8,053,277 B2* | 11/2011 | Yu | ........................ | H01L 25/0652 |
| | | | | 257/E21.511 |
| 9,576,930 B2* | 2/2017 | Tseng | ................... | H01L 23/3737 |
| 9,704,841 B2* | 7/2017 | Kuo | ......................... | H01L 24/94 |
| 10,553,548 B2* | 2/2020 | Neal | ........................ | H01L 23/18 |
| 2011/0278703 A1* | 11/2011 | Pagaila | .................... | H01L 24/19 |
| | | | | 257/659 |
| 2020/0111682 A1* | 4/2020 | Tsai | .................... | H01L 23/3192 |
| 2021/0028147 A1* | 1/2021 | Yu | ............................ | H01L 24/19 |
| 2021/0066254 A1* | 3/2021 | Yu | ............................ | H01L 23/13 |

* cited by examiner

*Primary Examiner* — Dale E Page
*Assistant Examiner* — Cristian A Tivarus
(74) *Attorney, Agent, or Firm* — Essential Patents Group, LLP

(57) ABSTRACT

Stacked die assemblies having a moisture sealant layer according to embodiments are described herein. A microelectronic package structure having a first die with a second and an adjacent third die on the first die. Each of the second and third die comprise hybrid bonding interfaces with the first die. A first layer is on a region of the first die adjacent sidewalls of the second and the third dies, and adjacent an edge portion of the first die. The first layer comprises a diffusion barrier material A second layer is over the first layer, the second layer, wherein a top surface of the second layer is substantially coplanar with the top surfaces of the second and third dies. The first layer provides a hermetic moisture sealant layer for stacked die package structures.

18 Claims, 21 Drawing Sheets

MOISTURE SEAL COATING OF HYBRID BONDED STACKED DIE PACKAGE ASSEMBLY

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Multiple die can be assembled into a single IC package. In some multi-die packages, die may be stacked upon each other wherein the various stacked die may be interconnected through a package substrate. Such stacked die units may advantageously combine IC die from heterogeneous silicon processes and/or combine small dis-aggregated die from the same silicon process. However, there are many challenges with integrating multiple IC die (including die stacked upon each other) into a package assembly. One issue is the possible diffusion of contaminates, including ambient moisture, that can ingress into an active die area through various interface layers. For example, in various 3D stacked die structures, it is possible for copper migration to occur through such interface layers into an active area of the die. Electrical shorts as well as copper corrosion could occur, thus resulting in yield and reliability issues for stacked die.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 2A-2M illustrate cross-sectional views of forming stacked die assemblies comprising a moisture seal coating, in accordance with some embodiments.

DETAILED DESCRIPTION

Figure 1A:
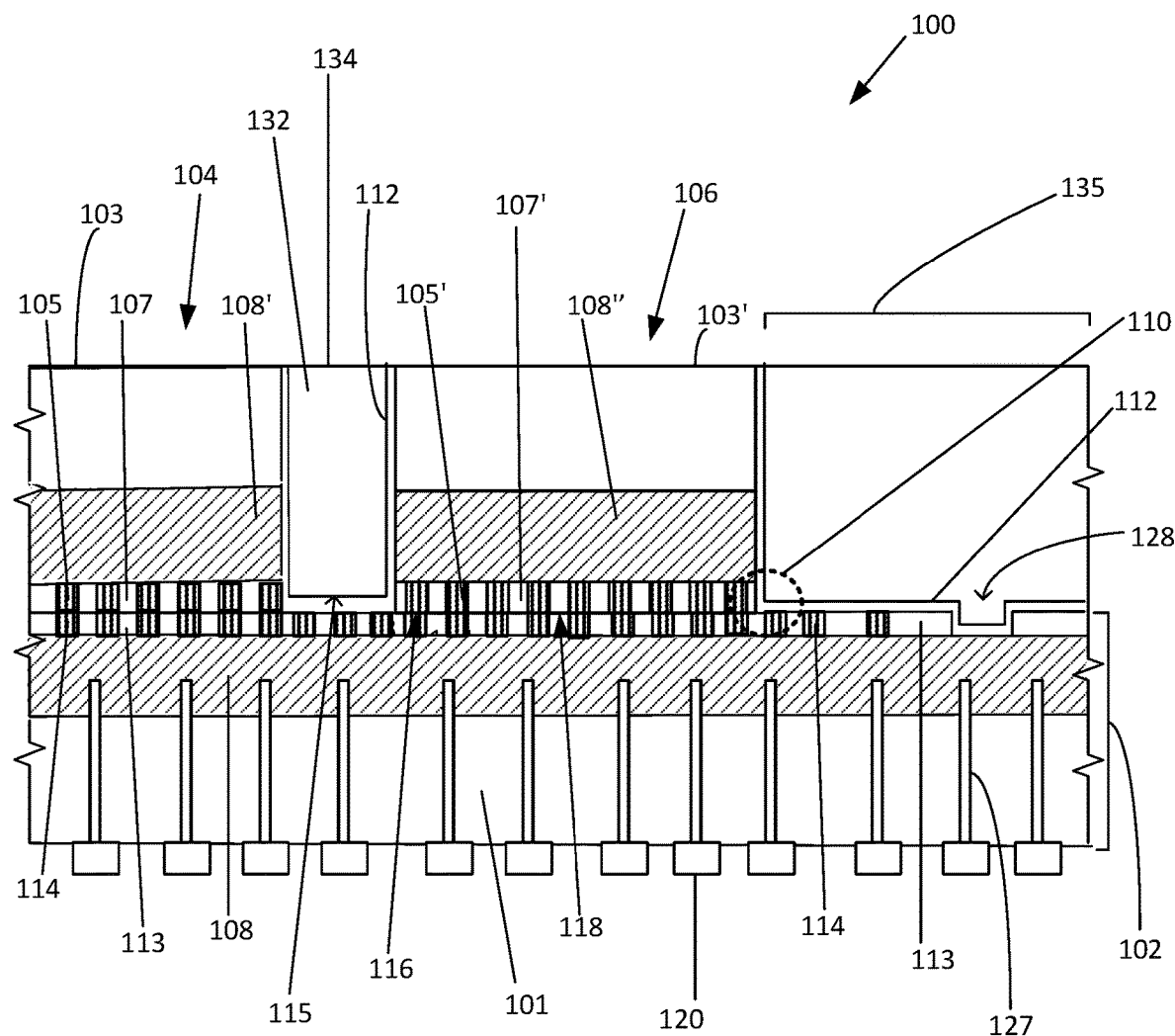
FIGS. 1A-1B are cross-sectional views of a multi-chip stack assembly comprising a moisture seal coating, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Stacked die assemblies having a moisture sealant layer according to embodiments are described herein. A microelectronic package structure having a first die with a second and an adjacent third die on the first die. Each of the second and third die comprise hybrid bonding interfaces with the first die. A first layer is on a region of the first die adjacent sidewalls of the second and the third dies, and adjacent an edge portion of the first die. The first layer comprises a diffusion barrier material A second layer is over the first layer, the second layer, wherein a top surface of the second layer is substantially coplanar with the top surfaces of the second and third dies. The first layer provides a hermetic moisture sealant layer for exposed moisture paths of stacked die package structures after the die stacking operation is completed.

The stacked die package structures described herein may be assembled and/or fabricated with one or more of the features or attributes provided in accordance with various embodiments. A number of different assembly and/or fabrication methods may be practiced to generate a stacked die package structure having one or more of the features or attributes described herein.

FIG. 1 is a cross-sectional view of a microelectronic package structure 100 comprising a moisture sealant layer, according to some embodiments. A first die 102 may comprise a base die to which any number of additional dies may be placed upon, in some embodiments. The first die 102 may comprise any integrated circuitry fabricated according to any microelectronic technology such as complementary metal oxide semiconductor (CMOS), SiGe, III-V or III-N HEMTs, etc.). The first die 102 may comprise a bulk silicon region and an active region, wherein the active region may comprise circuitry structures including metal routing layers within dielectric layers. The first die 102 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like.

The first die 102 may comprise a bulk silicon 101 region and an active region 108, wherein the active region 108 may comprise circuitry structures including metal routing layers within dielectric layers. The first die 102 comprises a first die dielectric material 113 between one or more first die conductive structures 114. The first die conductive structures 114 may be made of any appropriate conductive material, including but not limited to, metals, such as copper, silver, nickel, gold, aluminum, alloys thereof, and the like. The first die 102 may comprise conductive pads 120 on a surface of the first die 102 opposite the first die conductive structures 114, that may be made of any appropriate conductive material, including but not limited to, metals, such as copper, silver, nickel, gold, aluminum, alloys thereof, and the like. The first die 102 may comprise conductive vias 127 coupled to the conductive pads 120.

In an embodiment, the first die dielectric material 113 may comprise silicon dioxide. The first die conductive structures 114 may comprise any appropriate conductive material, including but not limited to, metals, such as copper, silver, nickel, gold, and aluminum, alloys thereof, and the like. The first die conductive structures 114 may be formed by any known process, including but not limited to plating. Plating processes, such as electroplating and electroless plating, are well known in the art and, for purposes of clarity and conciseness, will not be discussed herein.

A second die 104 and a third die 106 may comprise second die conductive structures 105 and third die conductive structures 105' respectively. The second die and third die 104, 106 may comprise a bulk silicon region and an active region 108', 108", wherein the active regions 108', 108" may comprise circuitry structures including metal routing layers within dielectric layers. The second and third die 104, 106 may be any appropriate die/device, including, but not limited to, a microprocessor, a chipset, a graphics device, a wireless device, a memory device, an application specific integrated circuit, a transceiver device, an input/output device, combinations thereof, stacks thereof, or the like. Individual ones of the second die conductive structures 105 are separated by second die dielectric material 107. Third die conductive structures 105' are separated by third die dielectric material 107'. First die dielectric material 113 is directly on the second die dielectric material 107 and is directly on the third die dielectric material 107'.

An interface region 118 between the first die dielectric material 113 and the second and third dielectric materials 107, 107' may comprise an insulator-insulator bonded region and may comprise a portion of a hybrid bond. An interface region 116 between the first die conductive structures 114 and the second and third conductive structures 105, 105' may comprise a metal-metal bonded region and may comprise a portion of a hybrid bond. In the hybrid bond, oxide portions are bonded together with Vander der Waals forces, while metal to metal bonds are formed by high temperature processing to be further described herein.

A first layer 112 may be on sidewalls of the second and third dies 104, 106 and may be on a region 135 of the first die 102, wherein the region 135 may comprise an edge region of the first die 102, in some embodiments. The first layer 112 may also be on a region of the first die 102 between the second die 104 and the third die 106. The first layer 112 may optionally be on a top surface 103 of the second die 104 and on a top surface 103' of the third die 106 (as shown in FIG. 2E, for example). The first layer 112 comprises a hermetic or moisture sealant coating layer and may comprise diffusion barrier materials. In some embodiments, the first layer 112 comprises an inorganic dielectric material. In some embodiments, the first layer is a single layer, wherein the layer comprises a single compound, such as a single layer of silicon nitride, for example. In some embodiments the first layer may comprise a single layer of a silicon oxynitride material.

The first layer 112 may comprise any such materials which prevent the ingress of undesirable materials into the underlying layers, such as the underlying dielectric 113 or underlying conductive structure 114 layers. Additionally, the first layer 112 may comprise materials which prevent the ingress of undesirable materials at first die, second die or third die 102, 104, 106 sidewall interfaces as well. For example, the first layer 112 can prevent copper migration and thus electrical shorts from occurring within the package structure 100 and can prevent copper corrosion within the package structure 100. In an embodiment, the first layer 112 may comprise such materials as alumina, silicon, oxygen, and combinations thereof. In an embodiment, the first layer 112 coats potential moisture paths that may ingress into a hybrid bond region between the first die 102 and the second die 104 or third die 106 within the stacked die package structure 100.

In some embodiments, the first layer 112 may comprise a conformally grown/and or deposited layer. In some embodiments the first layer 112 may comprise a multi-layer structure, such as a silicon nitride layer alternating with an alumina layer, for example. The first layer 112 may comprise such materials which provide appropriate adhesion as well as mechanical properties. In some embodiments, the first layer 112 may comprise a thickness of between about 50 nm to about 150 nm. The first layer 112 which is within the edge region 135 of the first die 102 may be on a corner region 110, on the first die conductive structures 114 and on a step structure 128. In some embodiments, the first layer 112 may comprise a first diffusion layer comprising a thickness of 50 to 100 nm and a second diffusion layer on the first diffusion layer comprising a thickness of 50 to 150 nm.

A second layer 132 is directly on the first layer 112. In an embodiment there are no intervening layers between the first layer 112 and the second layer 132. In some embodiments, the second layer 132 may comprise a dielectric material. In some embodiments, the second layer 132 may comprise an organic mold material but may include any suitable material for a fill material between the second and the third dies 104, 106. In some embodiments, the second layer 132 may comprise a surface 134 which may be substantially coplanar with top surfaces 103, 103' on the second die 104 and the third die 106. In some embodiments, the second layer 132 is over the first die 102 in a region 115 between the first and second dies 104, 106.

Figure 1B:
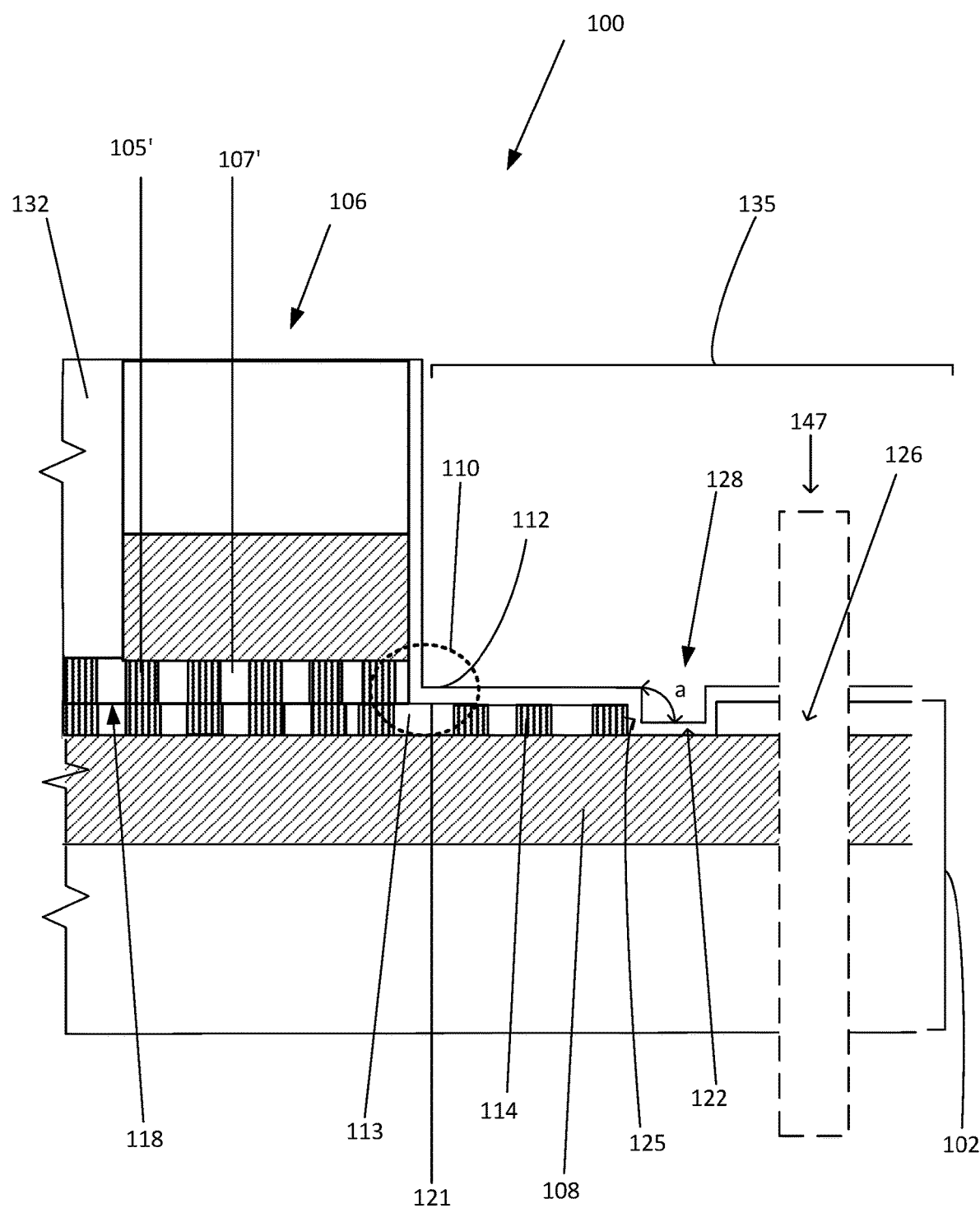

FIG. 1B depicts the first layer 112 located in the first die edge region 135 in more detail. The first layer 112 provides a moisture seal barrier for structures which could become exposed during assembly such as first die conductive structures 114. In some embodiments, first die conductive structures 114 may be utilized for subsequent wafer sort and/or wafer testing operations, for example. During such testing operations the first die conductive structures 114 may become oxidized in the absence of the first layer 112 protective sealing material. In some embodiments, the first layer 112 protects the first die dielectric material 113 located in a corner region 110 between a sidewall of the second (or first) die 106 and a surface 121 of the first die 102 from ambient moisture.

In some embodiments, the first layer 112 may be formed directly on the active area 108 of the first die 102, within the first die edge region 135 to form a step structure 128. The step structure 128 may comprise a first portion 122 of the first layer 112 that is directly on the first die active area 108 and a second portion 125 of the first layer 112 that is on a sidewall of the first die dielectric material 113. An angle "a" between the first portion 122 of the first layer 112 and the second portion 125 of the first layer 112 may comprise about 90 degrees in some embodiments.

The step structure 128 prevents moisture that could enter into the first die 102 active area 108 during subsequent processing, such as during a singulation process 147. For example, during a singulation/dicing operation, a portion of the first die 126 in the first die edge region 135 may be cut.

Subsequent to a cutting process 147, one or more moisture paths may be revealed at an edge portion 126 of the first die 102. The step structure 128 can block moisture that may penetrate into the active area 108. Thus, the first layer 112 provides a hermetic sealing layer which improves device reliability and performance for the various embodiments of the stacked die package structures according to embodiments herein.

Figure 2A:
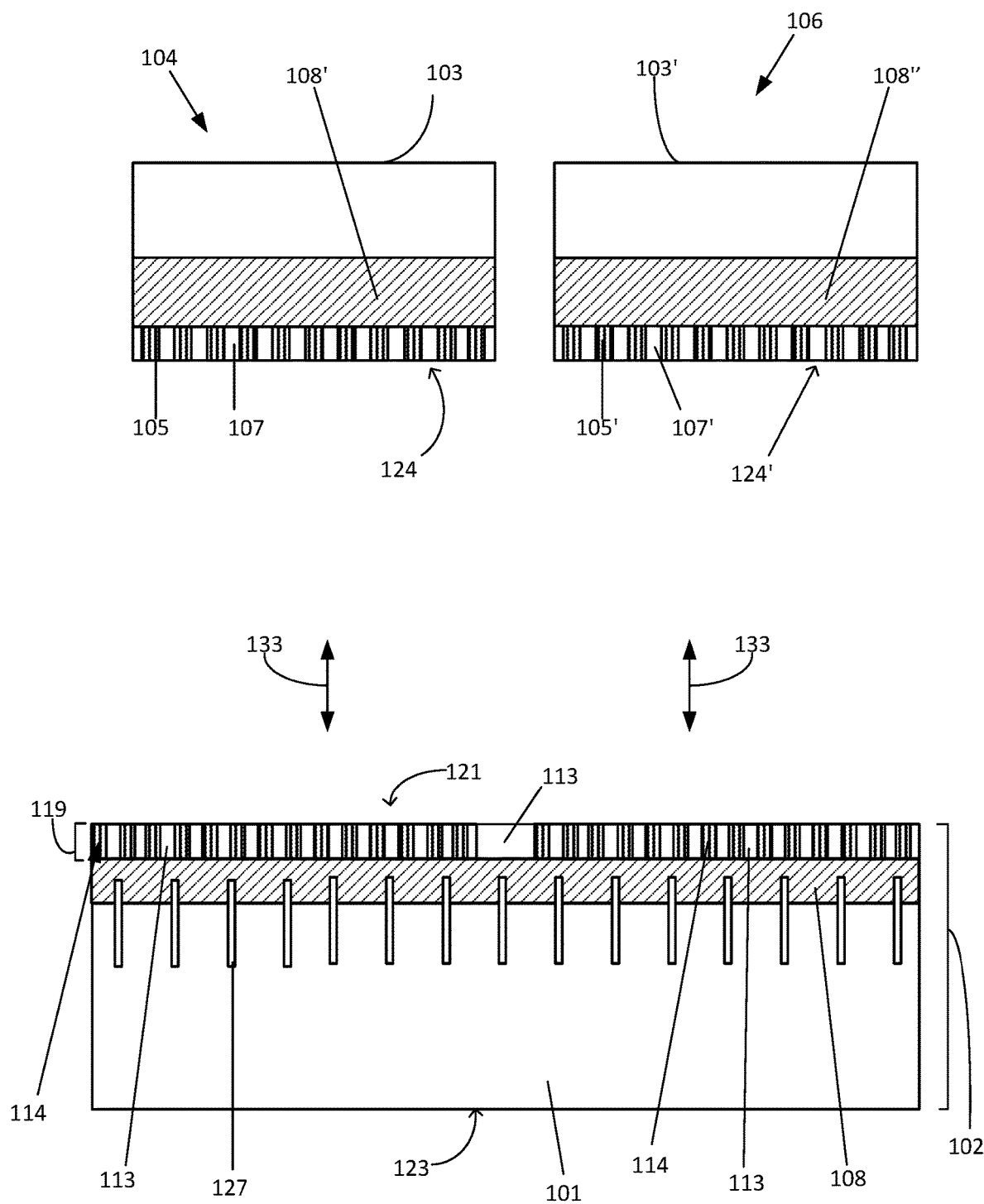
Figure 2B:
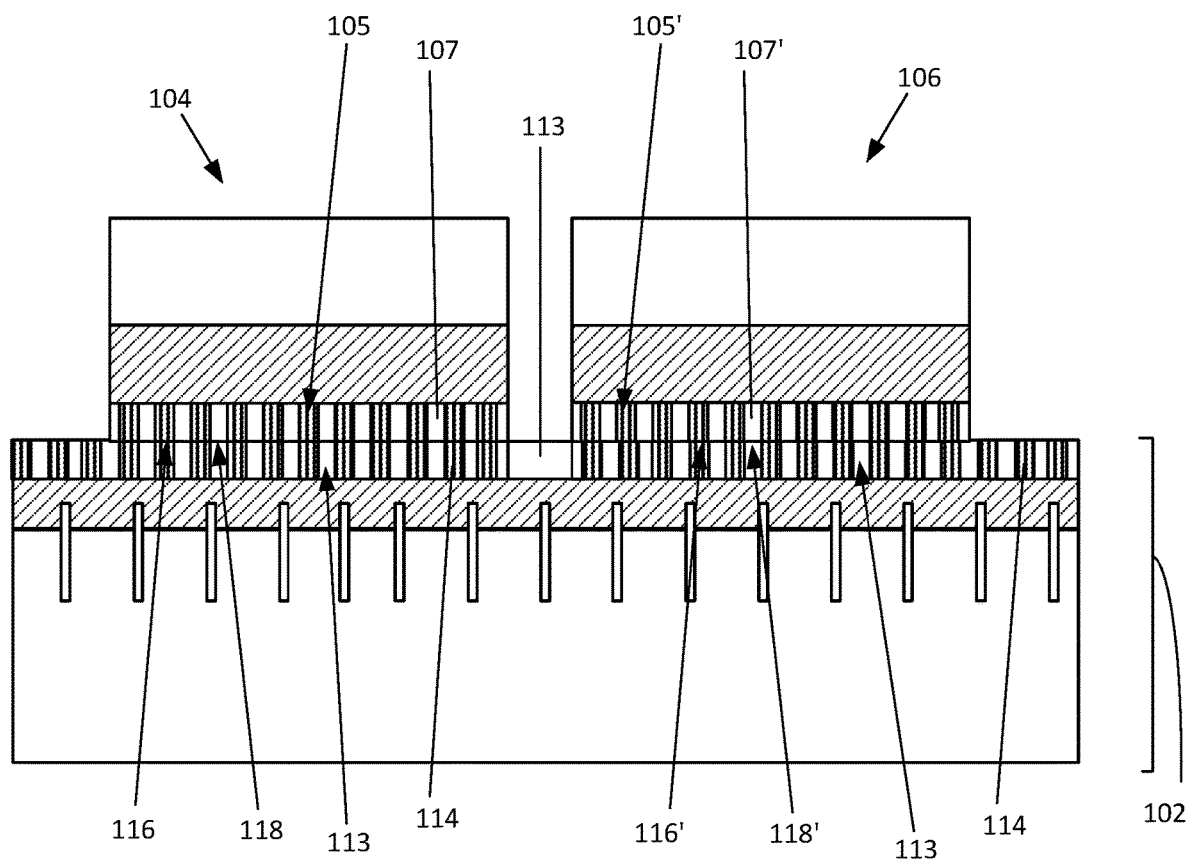
Figure 2C:
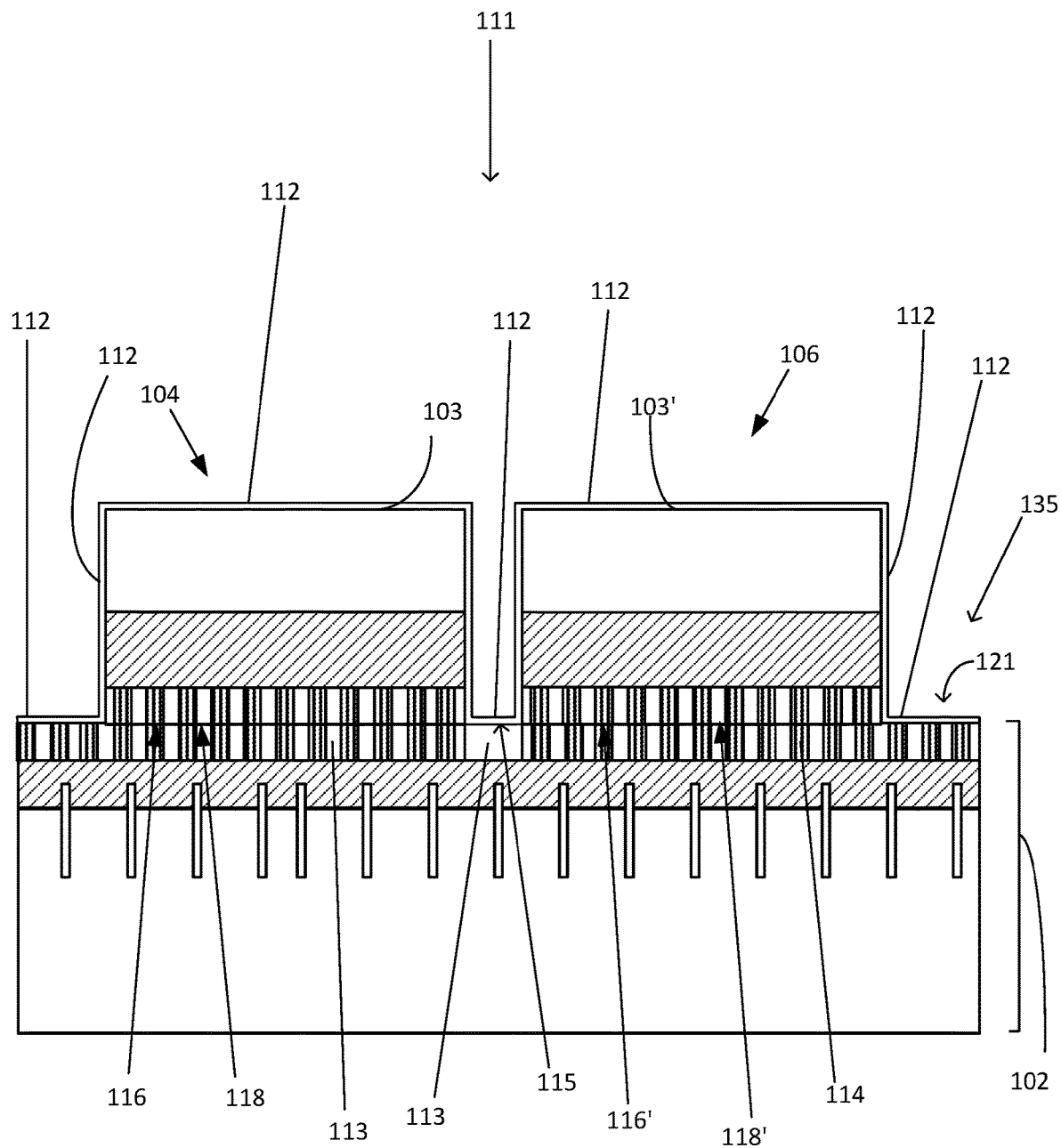
Figure 2D:
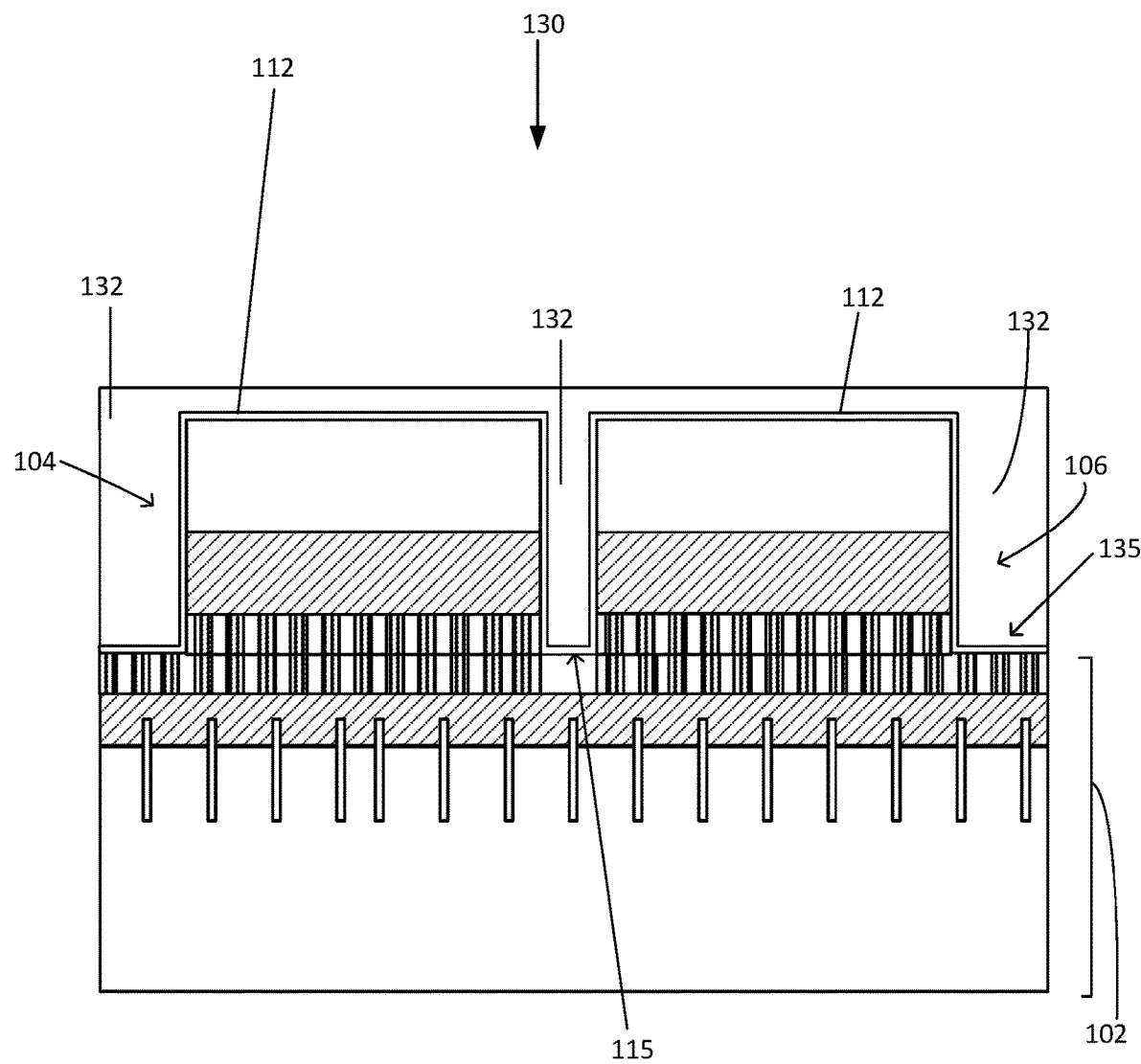
Figure 2E:
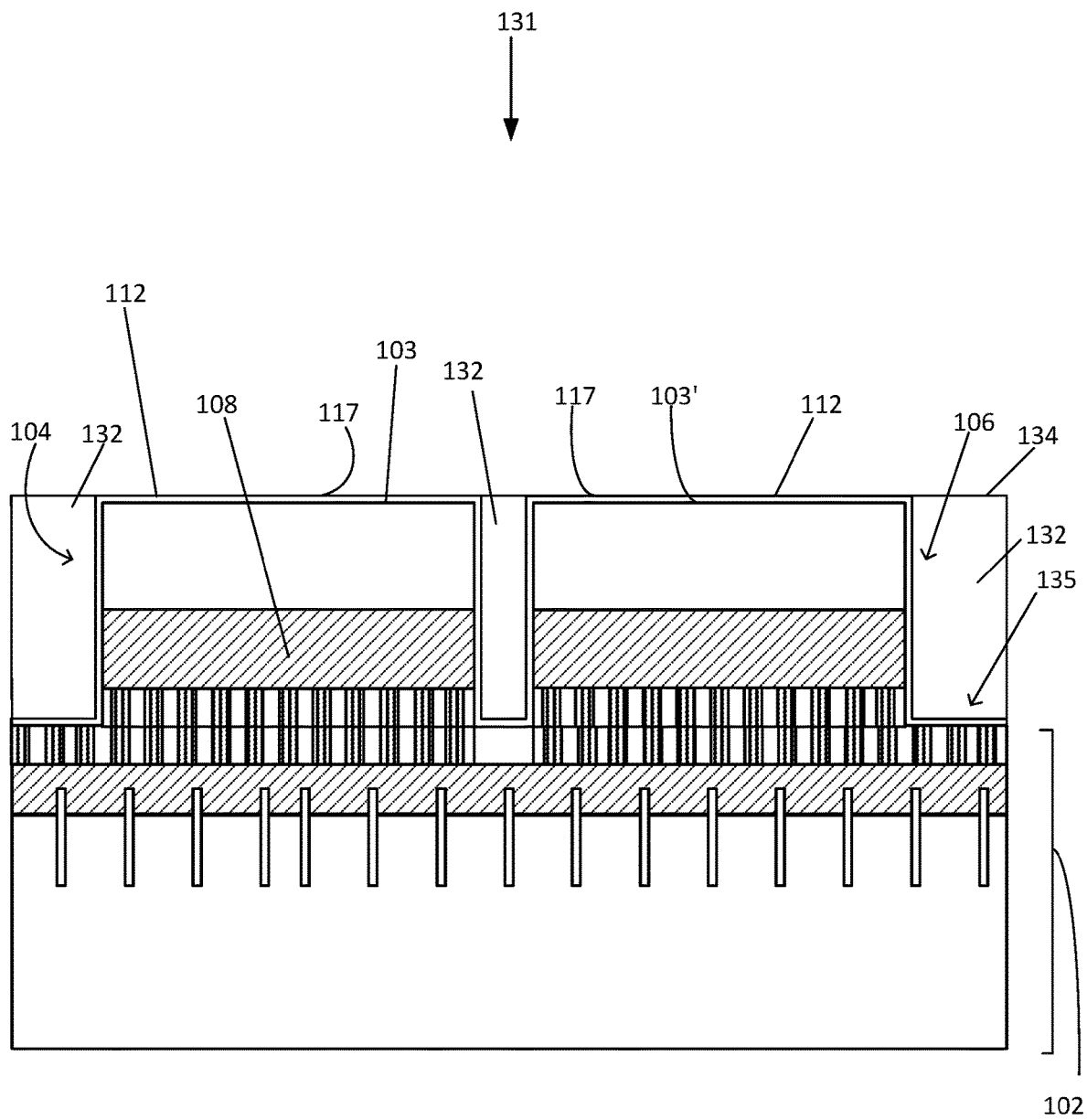

FIGS. 2A-2G depict the assembly of stacked die package structures including the moisture sealing first layer 112 according to some embodiments. In FIG. 2A, a first die 102 may be provided for assembly of a stacked die package structure. The first die 102 may comprise a first side 121 and a second side 123. The first die 102 may comprise any type of functionality, such as a graphics die, or a logic die, for example. An active region 108 is over a bulk silicon portion 101 of the first die 102. One or more first die conductive structures 114 may be over and electrically and physically coupled to the active area 108. The one or more first die conductive structures 114 may be separated by a first die dielectric material 113 and may comprise a first die bond layer 119. The one or more first die conductive structures 114 may comprise copper, in some embodiments, but may comprise any suitable conductive materials or alloys thereof. The first die dielectric material 113 may comprise silicon and oxygen, in some embodiments. In some embodiments, the first die dielectric material 113 may comprise any suitable dielectric material.

The first die 102 comprises conductive via structures 127 coupled to circuit components located in the active area 108, according to some embodiments. The conductive via structures 127 may extend partially into a bulk silicon region 101 of the first die 102. In some embodiments, the conductive via structures 127 may comprise through silicon vias. A second die 104 may comprise a first side 124 and a second side 103, and a third die 106 may comprise a first side 124' and a second side 103'.

First sides 124, 124' of the second die 104 and the third die 106 may be attached to the first side 121 of the first die 102 using a die attach process 133. The die attach process 133 may comprise a hybrid bonding die attach process, in some embodiments. The second die 104 may comprise second die conductive structures 105, and the third die 106 may comprise third die conductive structures 105'. The second die conductive structures 105 may be placed on the first die conductive structures 114, and the third die conductive structures 105' may be placed on the first die conductive structures 114. Also, second die dielectric material 107 and third die dielectric material 107' may be placed on the first die dielectric material 113.

The attachment process 133, which may comprise a hybrid bonding process, first bonds the second die dielectric material 107 (located on a first side 124 of the second die 104) and the third die dielectric material 107' (located on the first side 124' of the third die 106) to the first die dielectric material 113 through van der Waals adhesion between the dielectric materials. In some embodiments, the first, second and third dielectric materials 113, 107, 107' may comprise such dielectric materials as interlayer dielectric materials (ILDs) such as but not limited to dielectric materials comprising silicon and oxygen.

Secondly, through high temperature fusion bonding between first, second and third die conductive structures 113, 105, 105' metal bonding may occur at interface regions between the first die conductive structures 113 and the second and third die conductive structures 105, 105'.

FIG. 2B depicts the first, second and third dies 102, 104, 106 subsequent to undergoing the attachment process 133 of FIG. 2A. Metal to metal bonds have been formed at interface regions/mating surfaces 116, 116' between the first die conductive structures 114 and the second and third die conductive structures 105, 105'. Insulator to insulator bonds between the first die dielectric material 113 and the second and the third die dielectric material 107, 107' are formed at interface regions/mating surfaces 118, 118' through the reversible adhesion of Van der Waals forces. Subsequently, dielectric material 107, 107' forms covalent bonds with dielectric material 113.

FIG. 2C depicts a formation process 111 wherein a first layer 112 may be formed on top surfaces of the first, second and third dies 102, 104, 106. In some embodiments, the first layer 112 may be formed on the second sides 103, 103' and sidewalls of the second die 104 and third die 106. The first layer 112 may be formed on the first side 121 of the first die adjacent the sidewalls of the first and second dies 102, 104 and may be formed on a region 115 of the first die 102 between the second and third dies 104, 106. In some embodiments, the first layer 112 may be directly on the first die 102 in the edge region 135 of the first die 102 (as shown in greater detail in FIG. 1B, for example), and in other embodiments may be formed on a portion of the first die dielectric material 114.

In some embodiments the first layer 112 may comprise a diffusion barrier layer and may comprise a dielectric material. In some embodiments the first layer 112 may comprise one or more of a silicon or a nitrogen material, but the first layer 112 may comprise any material that is suitable for a barrier layer to form a hermetic seal for the stacked die package structures according to embodiments herein. The first layer 112 provides protection against moisture diffusion at and near the hybrid bond layer, at the first and second die side wall locations and provides protection at the first die surface area at the edge region 135.

In some embodiments, the first layer 112 may comprise a silicon nitride material and may comprise a thickness of less than about 150 nm. In other embodiments, the first layer 112 may comprise any suitable sealant and or diffusion barrier material, either organic or inorganic, and may comprise a thickness of between about 50 nm to about 150 nm. In some embodiments, the first layer 112 may comprise silicon carbide, silicon carbon nitride, copper, aluminum, or carbon and combinations thereof, or any suitable moisture resistant materials. FIG. 2D depicts a formation process 130 wherein a second layer 132 is formed on the first layer 112.

The second layer 132 may comprise an epoxy mold material but may comprise any suitable material for a package fill layer. In some embodiments, the second layer 132 may comprise a conformal coated version of a Die Backside Cold Spray (DBCS). The DBCS may comprise a thermally conductive material such as copper and/or aluminum, for example. In some embodiments, the second layer 132 may be over top surfaces 103, 103' of the second die 104 and the third die 106. In some embodiments, the second layer 132 is over the first die 102 in a region 115 between the second and third dies 104, 106 and over the edge region 135 of the first die 102.

Figure 2F:
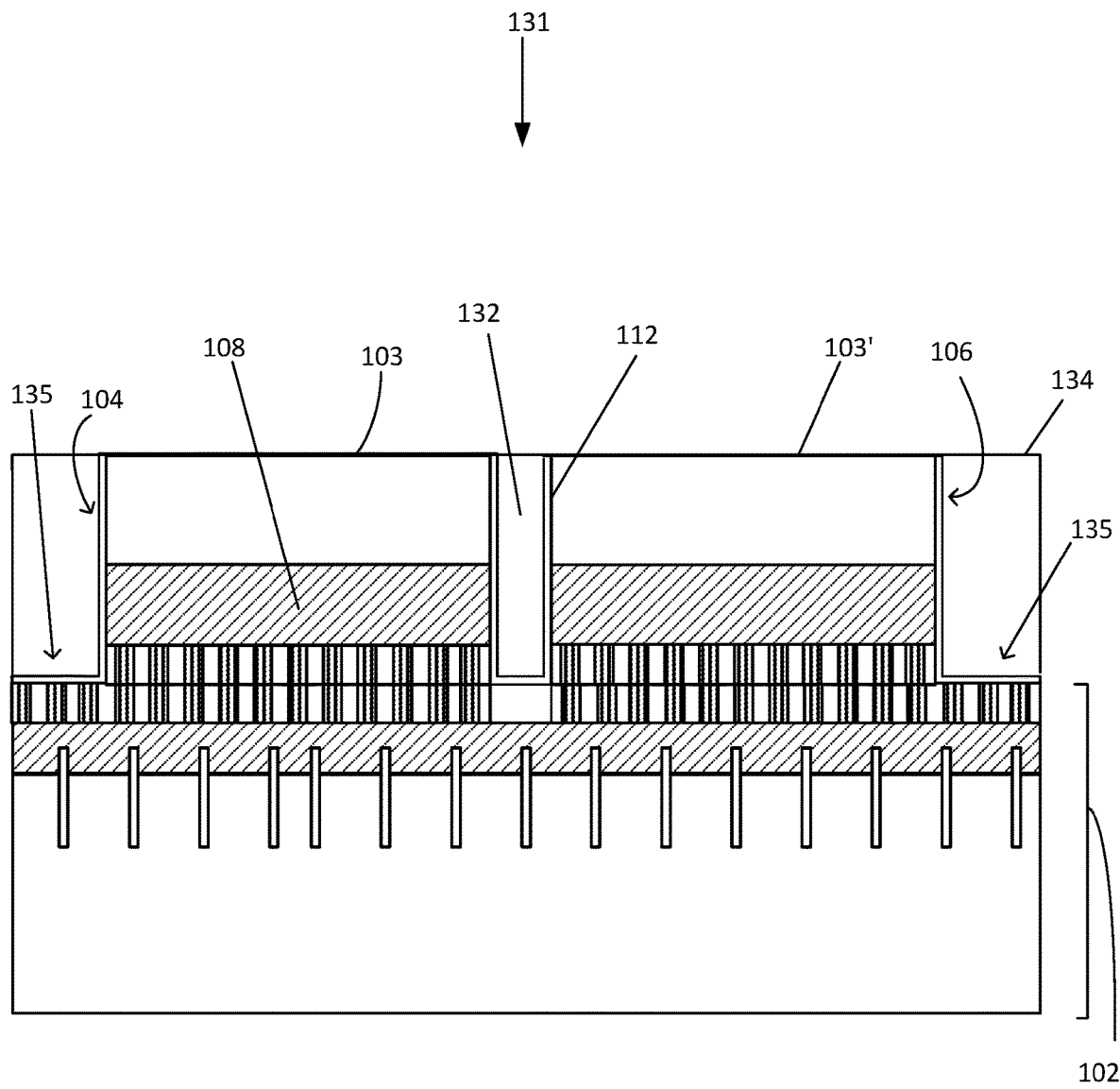
Figure 2G:
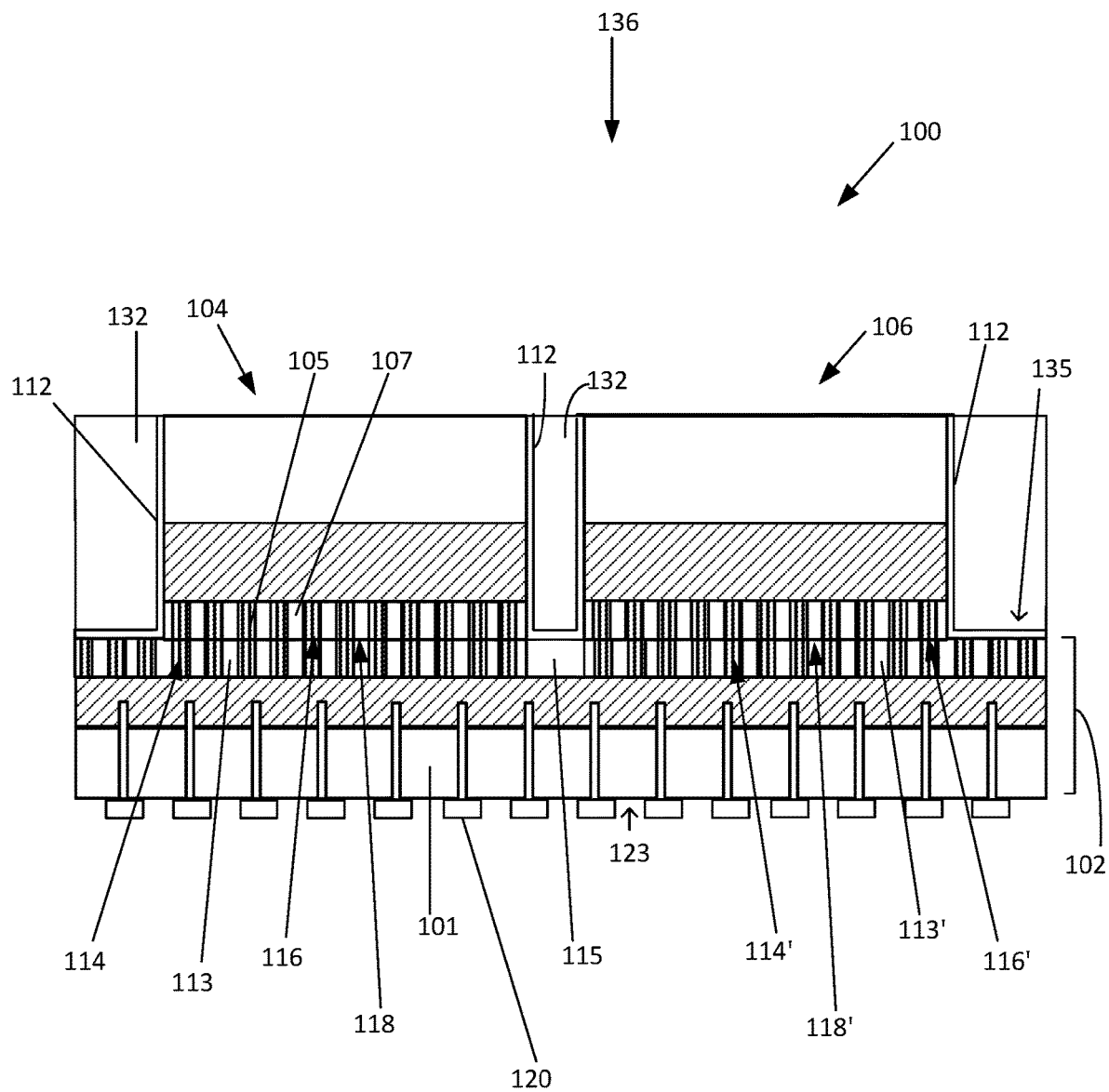

FIGS. 2E-2F depict a planarization process 131. The planarization process 131 removes a portion of the second layer 132 such that a surface 134 of the second layer 132 is substantially coplanar with a top surface 117 of the first layer 112 (FIG. 2E), and in some embodiments the planarization process 131 removes a portion of the second layer 132 such that a surface 134 of the second layer 132 is substantially coplanar with top surfaces 103, 103' of the second and third dies 104, 106 (FIG. 2F). FIG. 2G depicts a pad formation process 136 in which the bulk silicon portion 101 of the first die 102 is ground down and conductive pads 120 are formed on the second side 123 of the first die 102 according to any suitable grinding and pad formation process as are known in the art. The conductive pads 120 may compose any suitable conductive material and alloys thereof, including copper, for example. The conductive pads 120 are available for conductively coupling the 3D stacked die package structure 100 to any suitable interface, such as an interposer and/or system componentry.

Figure 2H:
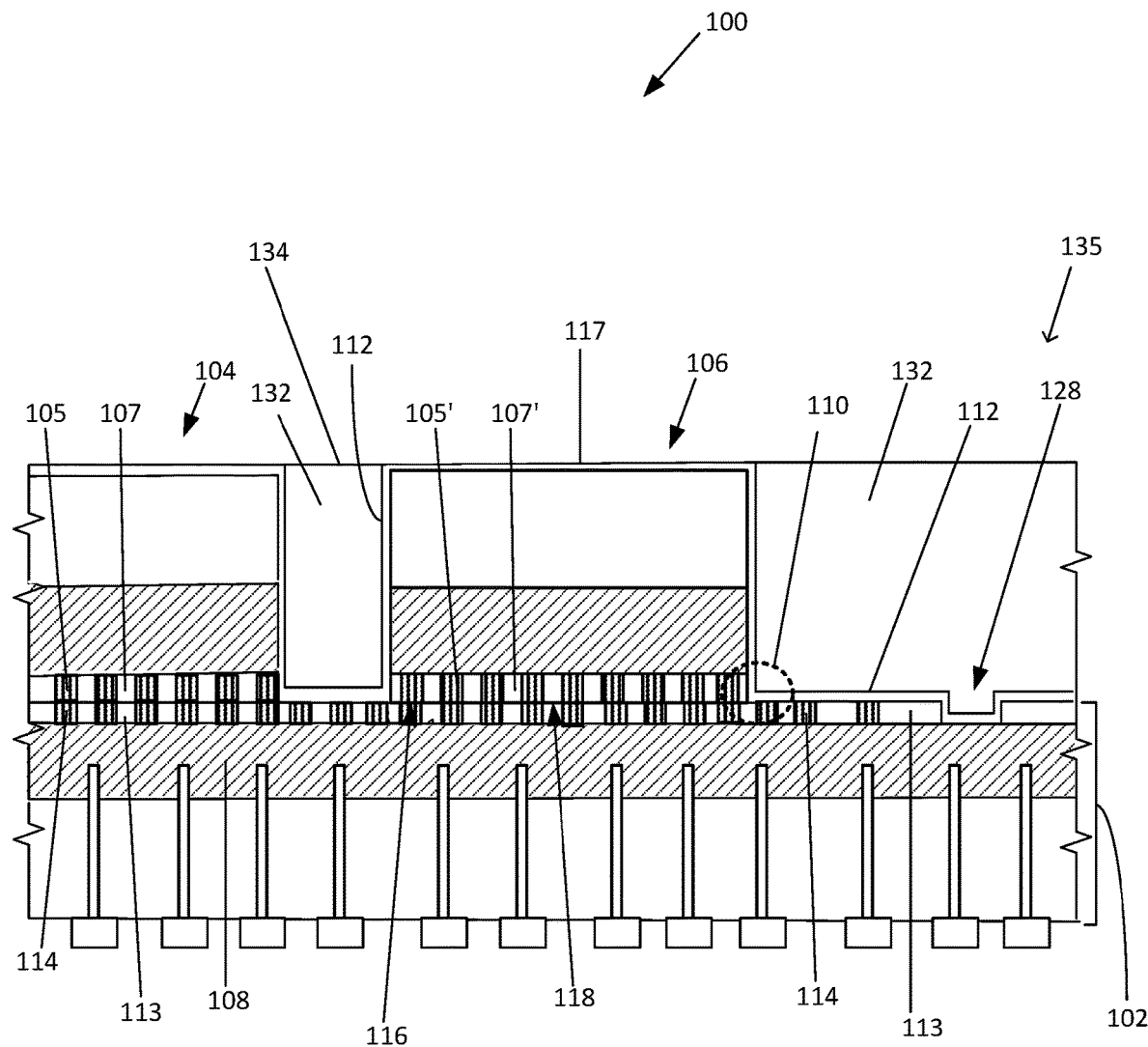
Figure 21:
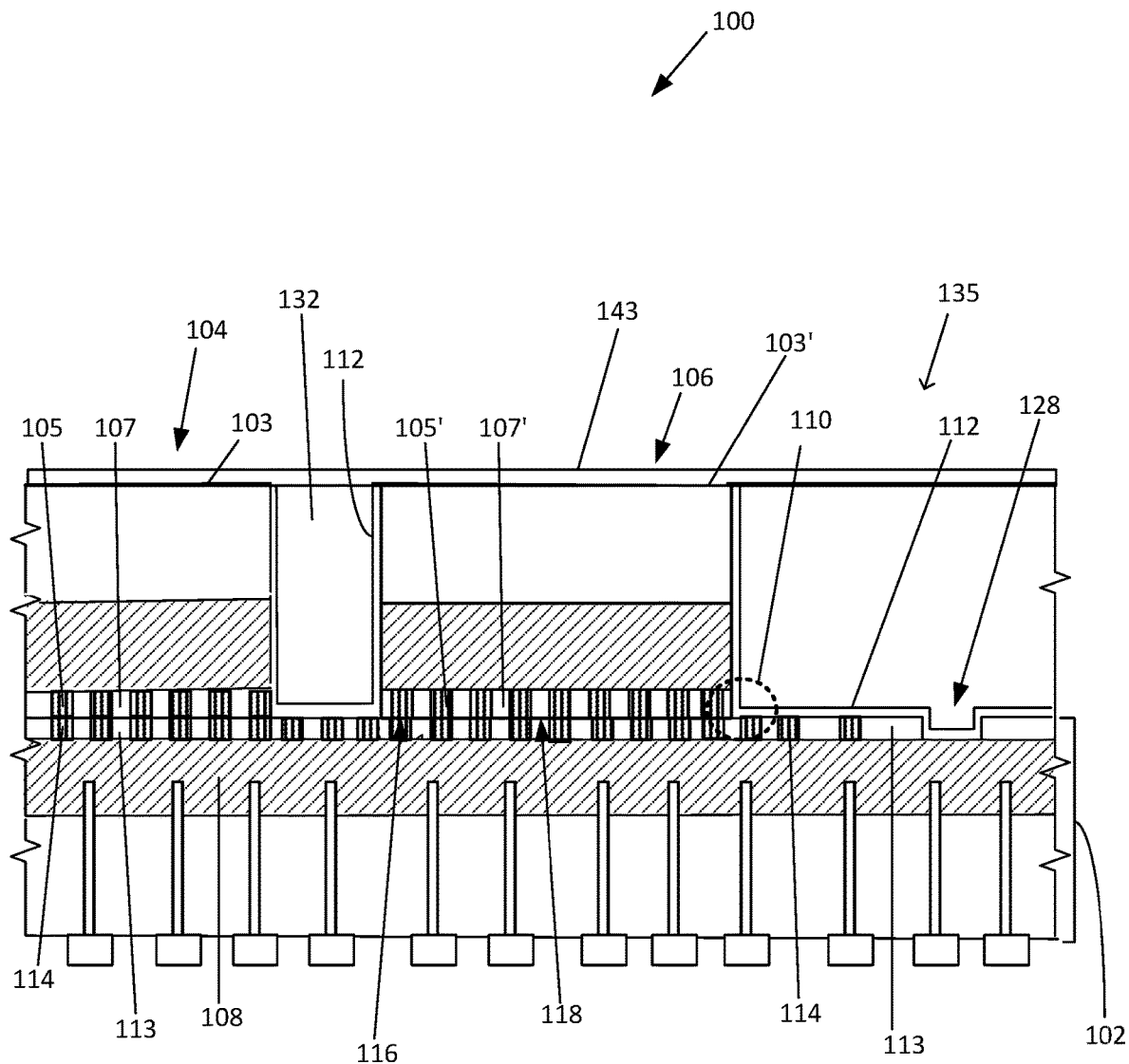

FIG. 2H depicts an embodiment of the package structure 100 wherein the surface 134 of the second layer 132 is substantially coplanar with the top surface 117 of the first layer 112 and is over the edge region 135 of the first die 102. FIG. 2I depicts an embodiment of the package structure 100 wherein the second layer 132 is substantially coplanar with top surfaces 103, 103' of the second and third die 104, 106 and is over the edge region 135 of the first die 102. A die backside metallization layer 143 may be on the surfaces 103, 103' of the second and third dies 104, 106, in some embodiments. The die backside metallization layer 143 may comprise such materials as gold and may comprise a plated gold material in some embodiments. The die backside metallization layer 143 may be on the bare silicon surfaces of any of the dies of the embodiments included herein.

Figure 2J:
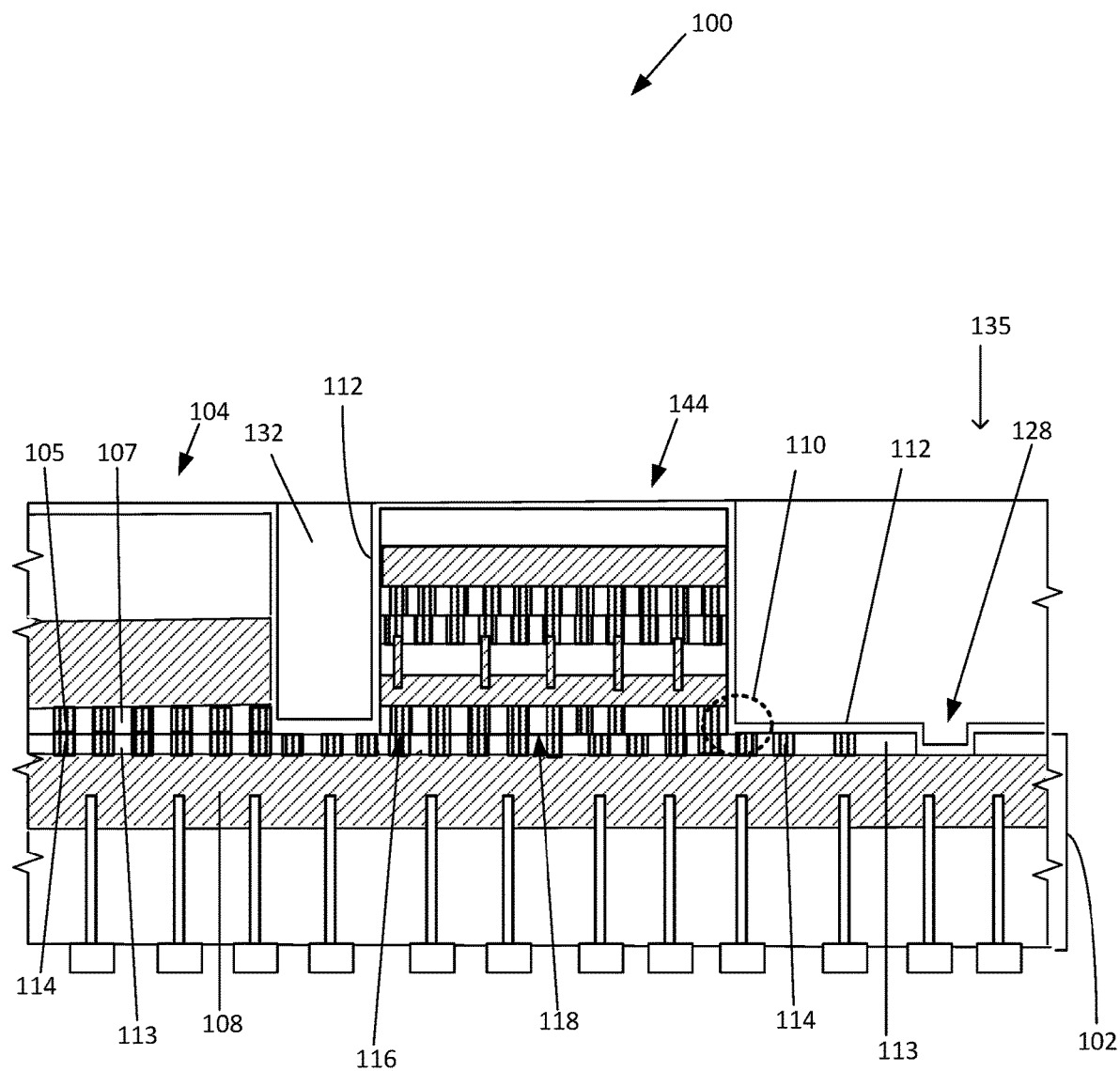
Figure 2K:
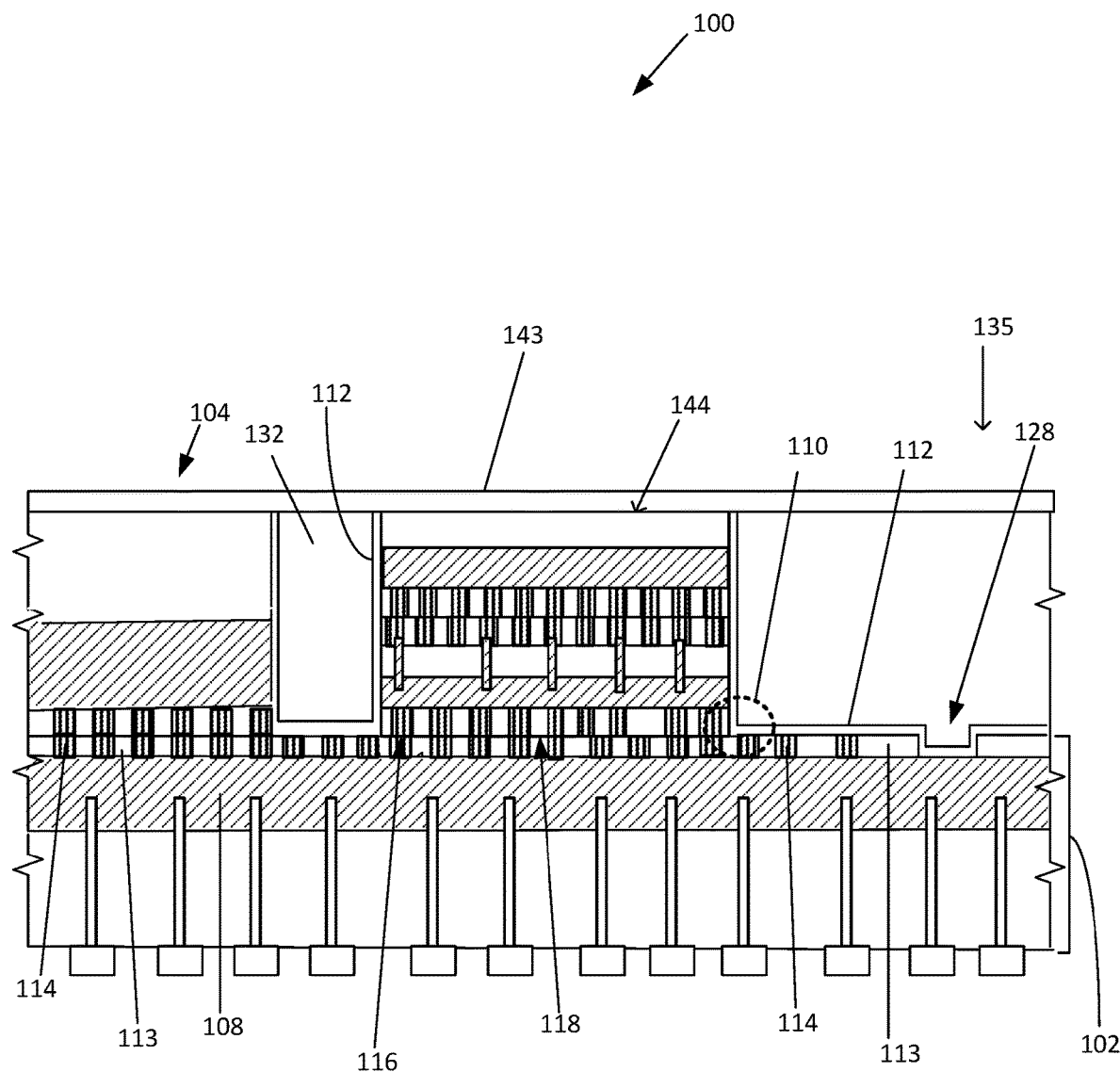

FIG. 2J depicts an embodiment of the package structure 100 wherein at least one of the dies on the first die 102, for example die 144, comprises a stacked die cube structure 144 with a two high die stack or greater than a two high die stack. Within the stacked die cube structure 144 the die stack can be face-to-back, face-to-face or some combination thereof. In some embodiments, some of the dies on the first die 102 may be stacked-die-cube structures while others of the dies may be monolithic or also stacked-die-cube of the same or different number dies within. For example, FIG. 2K depicts a stacked die cube structure 144 comprising two die stacked face-to-back on the first die adjacent a single die 104, wherein dies 104, 144 are on the first die 102. The die backside metallization layer 143 may be on the bare silicon surfaces of the dies 104, 144, and is over the edge region 135 of the first die 102.

Figure 2L:
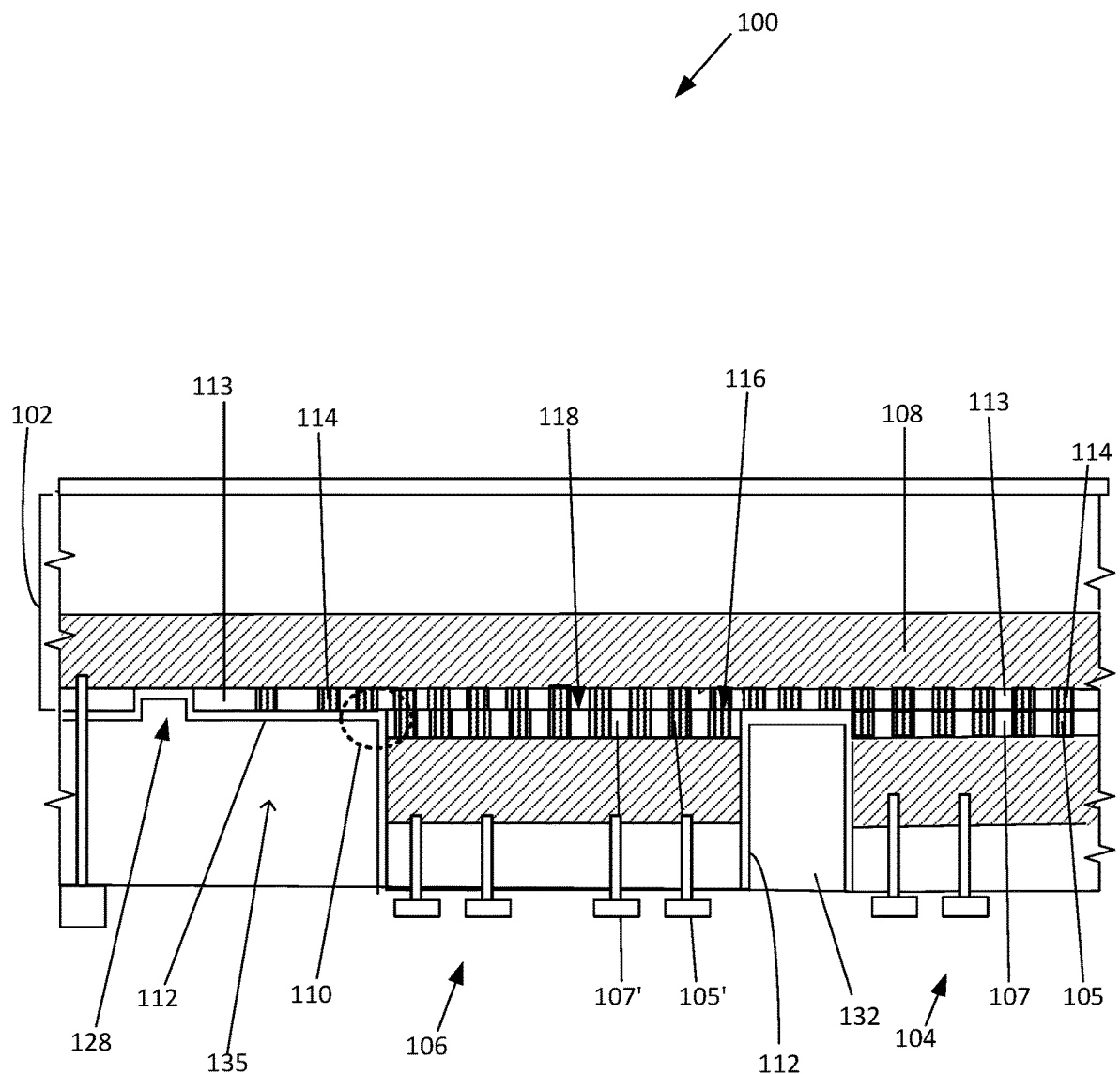
Figure 2M:
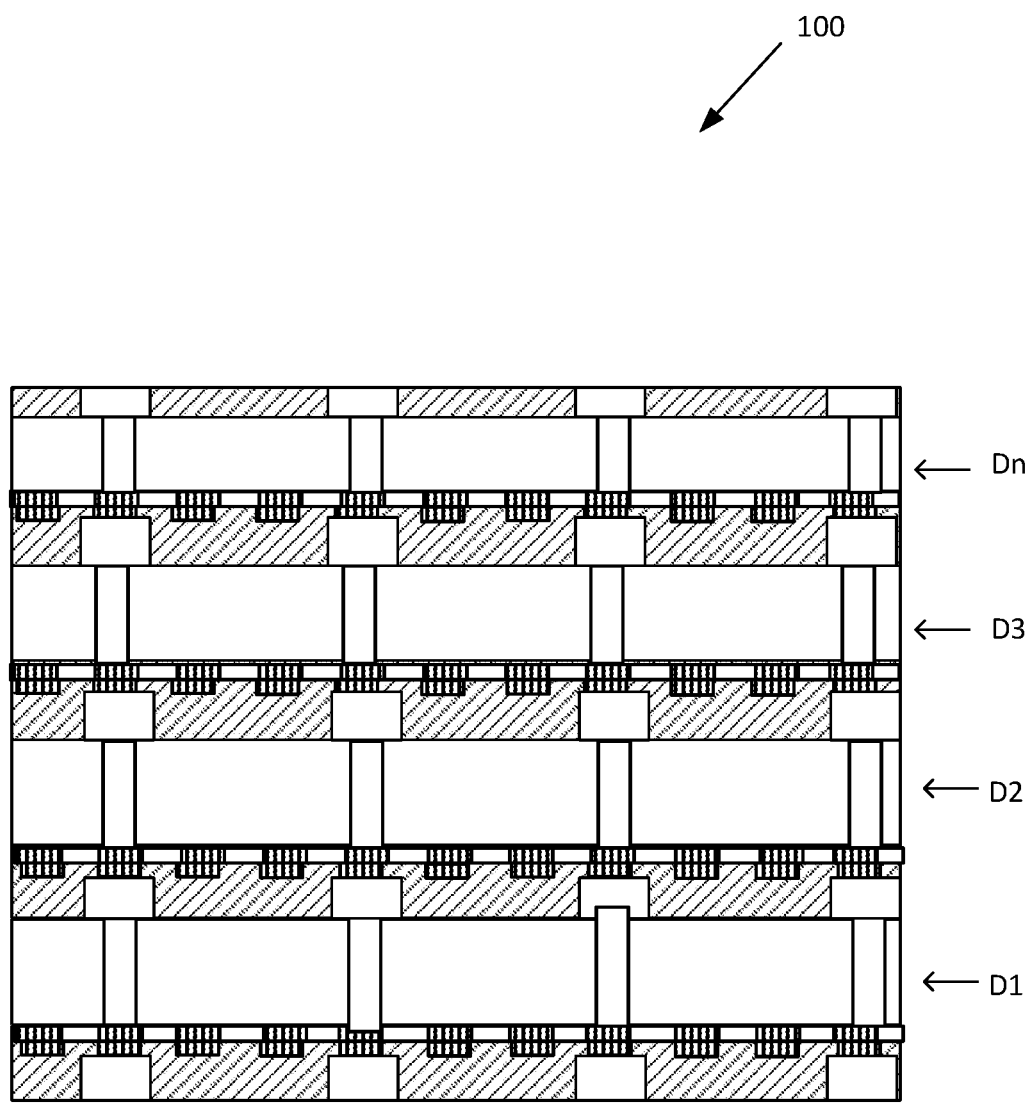

FIG. 2L depicts an embodiment of a packaged stacked die structure 100 wherein the first layer 112 is on the edge portion 135 of the first die 102 and wherein the first die 102 comprises a top die that is larger than the bottom dies 104, 106. FIG. 2M is a general depiction a stacked die package structure 100 which may comprise any number of equally sized die, D1 to Dn, stacked upon each other. The stacked die package structure 100 may comprise a memory cube. The stacked die package structure 100 includes the first layer 112 wherein the first layer 112 is on the edge portion 135 (not shown) of the any of the die D1 to Dn.

Figure 3A:
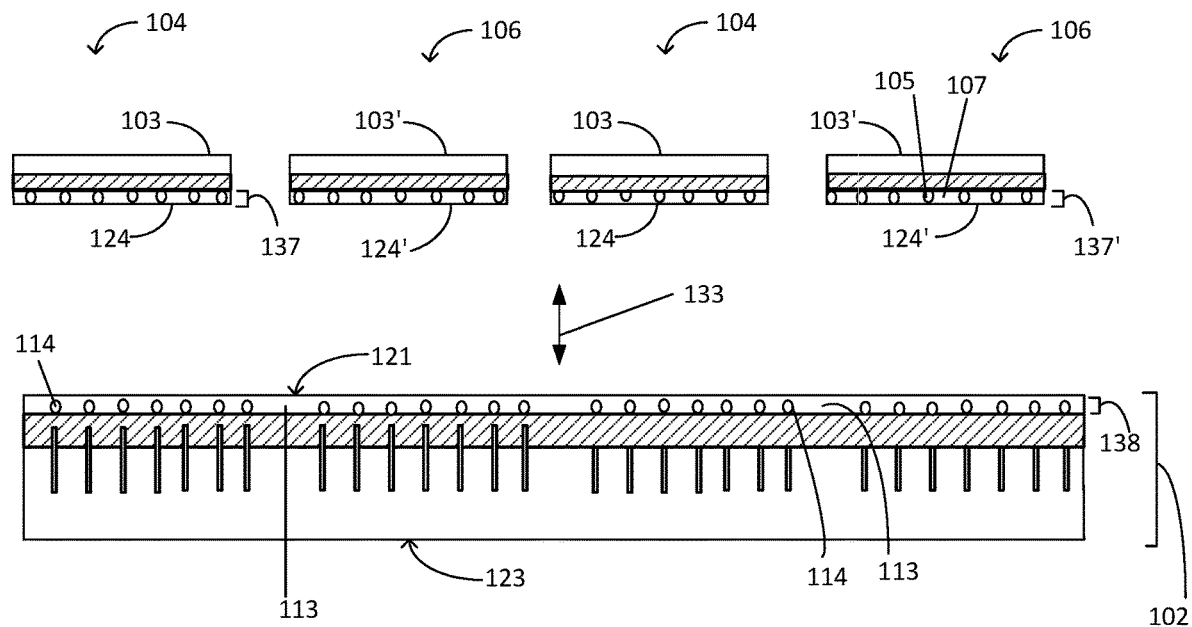
FIGS. 3A-3G illustrate cross-sectional views of forming stacked die assemblies comprising a moisture seal coating, in accordance with some embodiments.

FIGS. 3A-3F depict methods of forming a stacked die package structure including a diffusion barrier layer according to some embodiments herein. In FIG. 3A, a substrate 102, which may comprise a wafer in some embodiments, or any other suitable package substrate structure, and may comprise a first die bonding layer 138. The bonding layer 138 may comprise one or more first die conductive structures 114 and first die dielectric material 113, wherein the first die conductive structures 114 are separated by the first die dielectric material 113. The first die 102 may comprise a first side 121 and a second side 123. One or more second die 104 and adjacent third die 106 may be provided for attachment to the first die 102.

The one or more second die 104 and third die 106 may comprise first sides 124, 124' and second sides 103, 103' respectively. The second and third dies 104, 106 comprise a second and a third bonding layers 137, 137'. The second and third die bonding layers 137, 137' may comprise one or more second and third die conductive structures 105, 105' and second and third die dielectric material 107, 107', wherein the second and third die conductive structures 105, 105' are separated by the second die dielectric material 113, 113'.

Figure 3B:
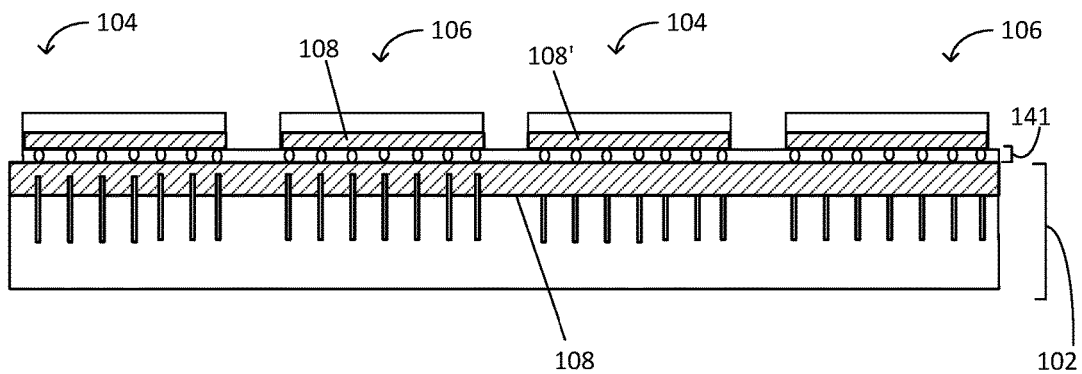

The hybrid bonding process 133 may comprise a first operation wherein Van der Waals bonding between first die dielectric material 114 and second and third die dielectric material 107, 107' may occur. In some embodiments, low temperature compression may be used to form the dielectric bonds between the first die and the second and third die. In a second operation of process 133, a higher temperature thermal compression operation may be performed to form metal to metal bonds between the first die conductive structures 114 and second and third die conductive structures 105, 105'. FIG. 3B depicts the hybrid bond layer 141 that is formed between first second and third dies 102, 104, 106. The hybrid bond layer 141 may electrically and physically couple the first die active area 108 to the second and third die active areas 108', 108".

Figure 3C:
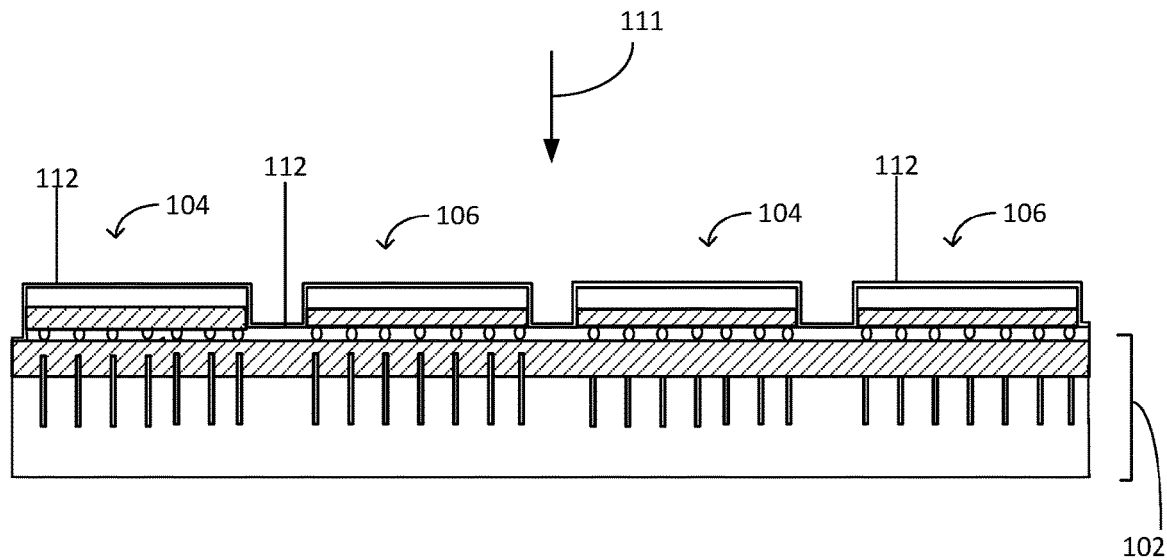

FIG. 3C depicts a formation process 111 wherein a first layer 112 is formed on the first side of the first die 102, and on the second sides 103, 103' of the second and third dies 104, 106. The first layer 112 may comprise an inorganic dielectric material in some embodiments but may comprise any suitable material that may provide a diffusion barrier material, such as a hermetic moisture barrier in some embodiments. Such materials as silicon nitride and/or silicon oxynitride and the like may be utilized in order to form the first layer 112. In some embodiments, the first layer 112 may be formed using a chemical vapor deposition (CVD) process and/or an atomic layer deposition (ALD) process. In some embodiments, the first layer 112 may comprise a thickness of between about 50 nm to about 150 nm. In an embodiment, first layer 112 may comprise a conformal silicon nitride layer. In other embodiments the first layer 112 may be formed utilizing an atomic layer deposition (ALD) process and may comprise at least one of an alumina material or a silicon material. In some embodiments the first layer 112 may comprise a composite layer (i.e. sequential layers of different materials) and may be optimized for adhesion and/or processability, for example.

Figure 3D:
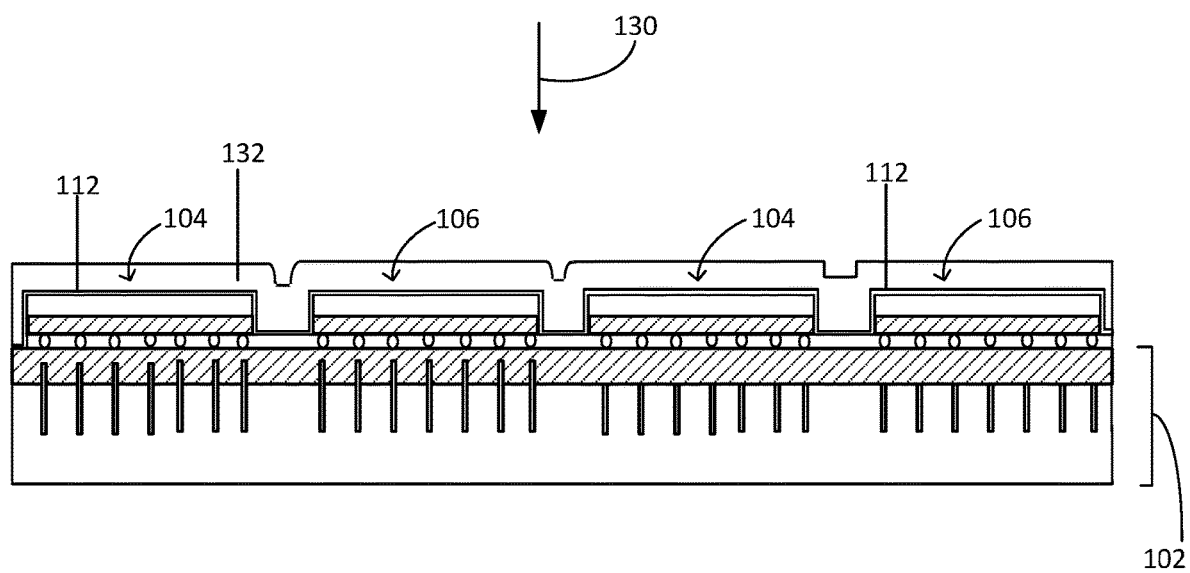
Figure 3E:
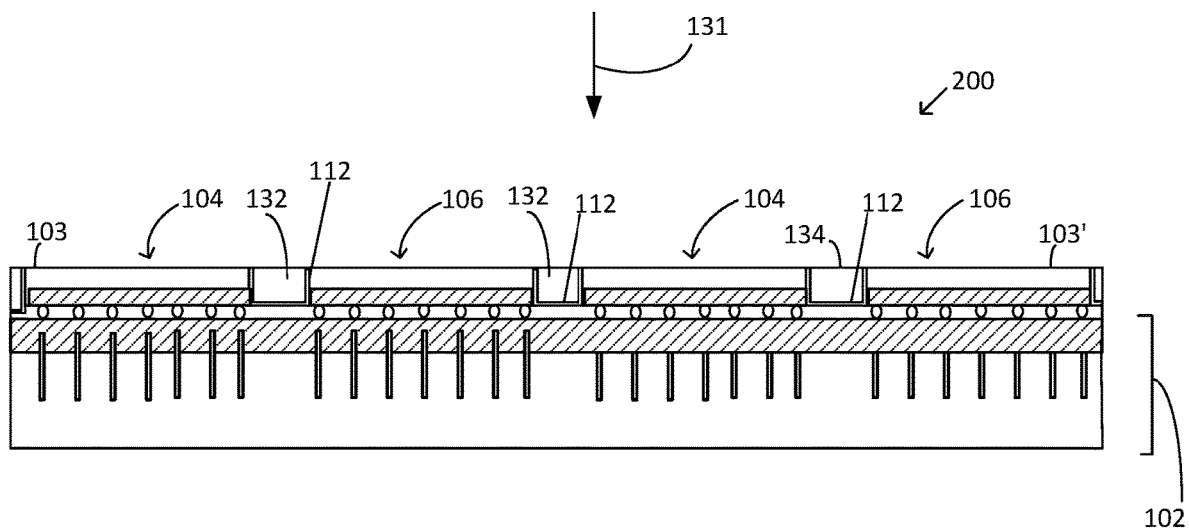

FIG. 3D depicts the formation of a second layer 132 on the first layer 112 by utilizing a fill formation process 130. In some embodiments, the second layer 132 may comprise an epoxy mold material and may be formed by any suitable process, as is known in the art. FIG. 3E depicts a planarization process 131. In some embodiments, the planarization process 131 may comprise a chemical planarization process (CMP) wherein a portion of the second layer 132 may be removed such that a surface 134 of the second layer 132 may be substantially coplanar with top surfaces 103, 103' of the first and second dies 104, 106.

Figure 3F:
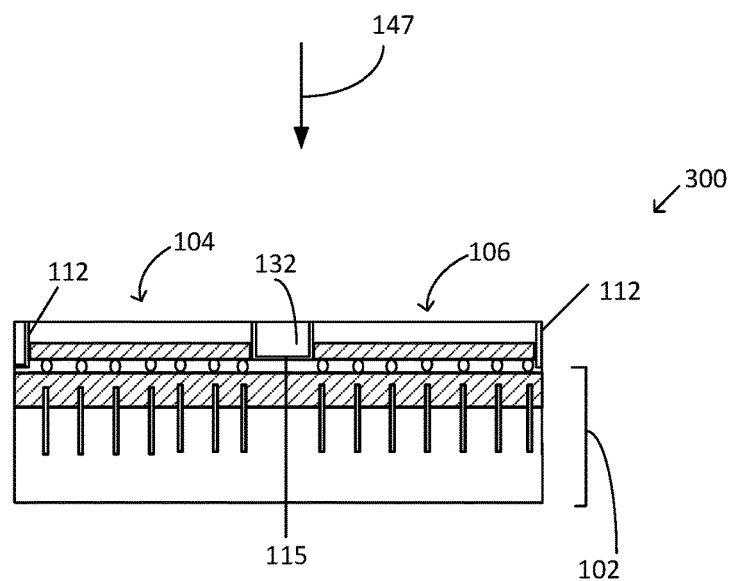
Figure 3G:
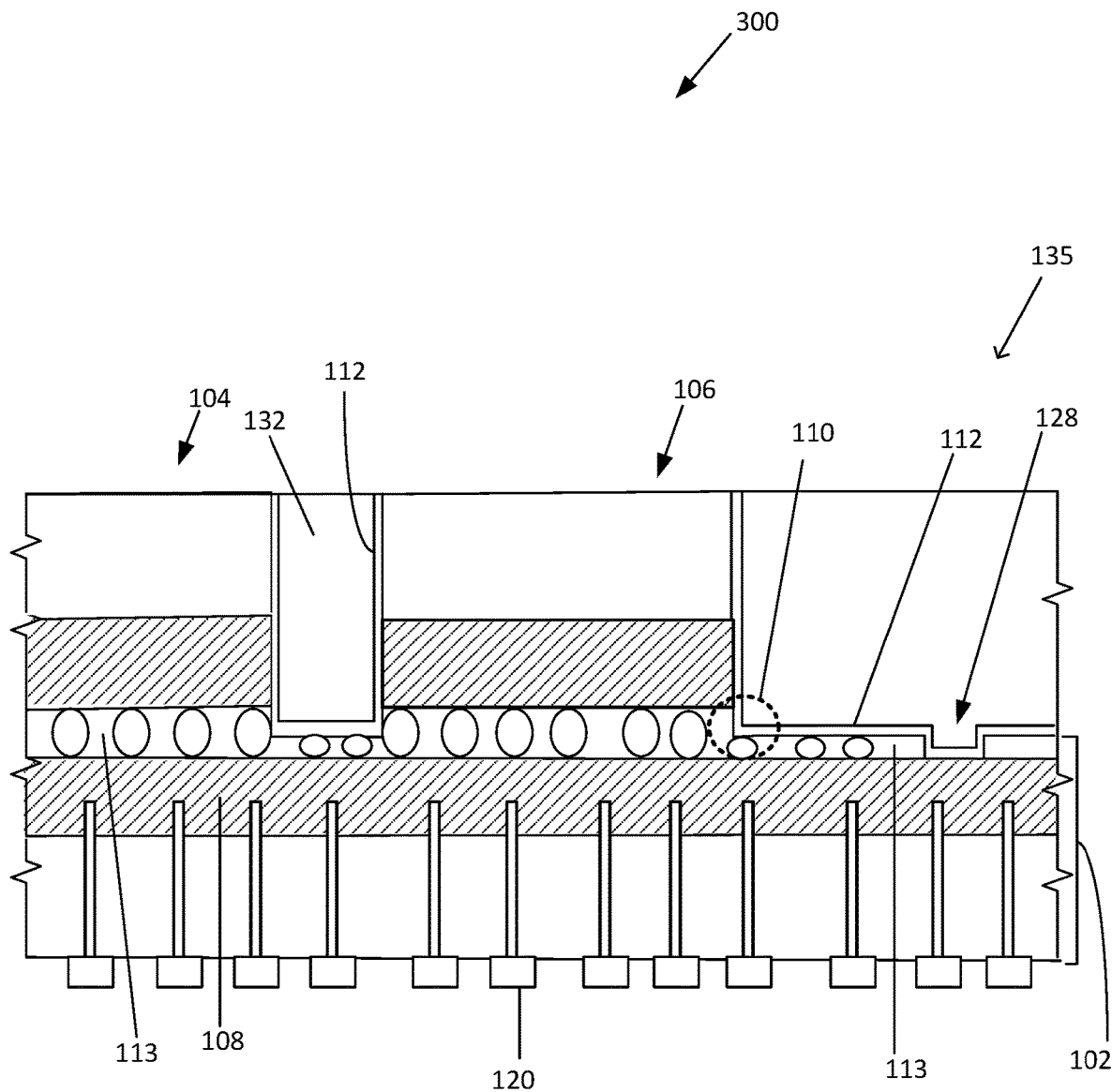

FIG. 3F depicts a portion of a 3D stacked die package structure 300 subsequent to a singulation process 147 of the wafer structure 200 of FIG. 3E. The 3D stacked die package structure 300 comprises a moisture barrier layer 112 as shown in more detail in FIG. 1B. FIG. 3G depicts the 3D stacked die package structure 300 subsequent to a pad formation process 138, as are well known in the art. The first die 102 may comprise conductive vias 127 coupled to the conductive pads 120.

Figure 4:
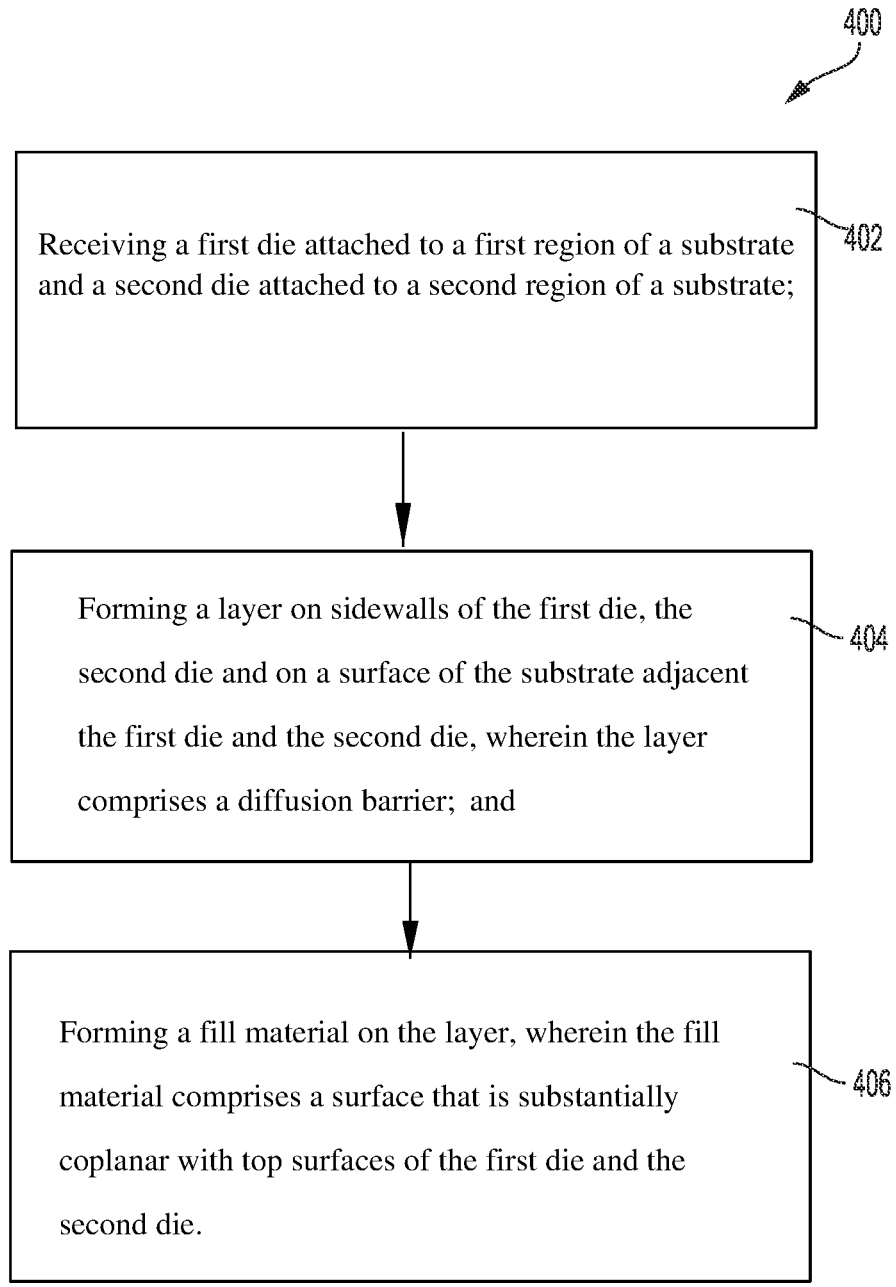
FIG. 4 illustrates a flow chart of a process that includes forming stacked die assemblies comprising a moisture seal coating, in accordance with some embodiments.

FIG. 4 is a flow chart of a process 400 of fabricating a stacked die package structure according to some embodiments. As set forth in block 402, a substrate is received wherein a first die is attached to a first region of the substrate and a second die is attached to a second region of a substrate. As set forth in block 404, a layer is formed on sidewalls of the first die, the second die and on a surface of the substrate adjacent the first die and the second die, wherein the layer comprises a diffusion barrier.

A fill material may be formed on the layer, wherein the fill material comprises a surface that is substantially coplanar with top surfaces of the first die and the second die as set forth in block 406.

Figure 5:
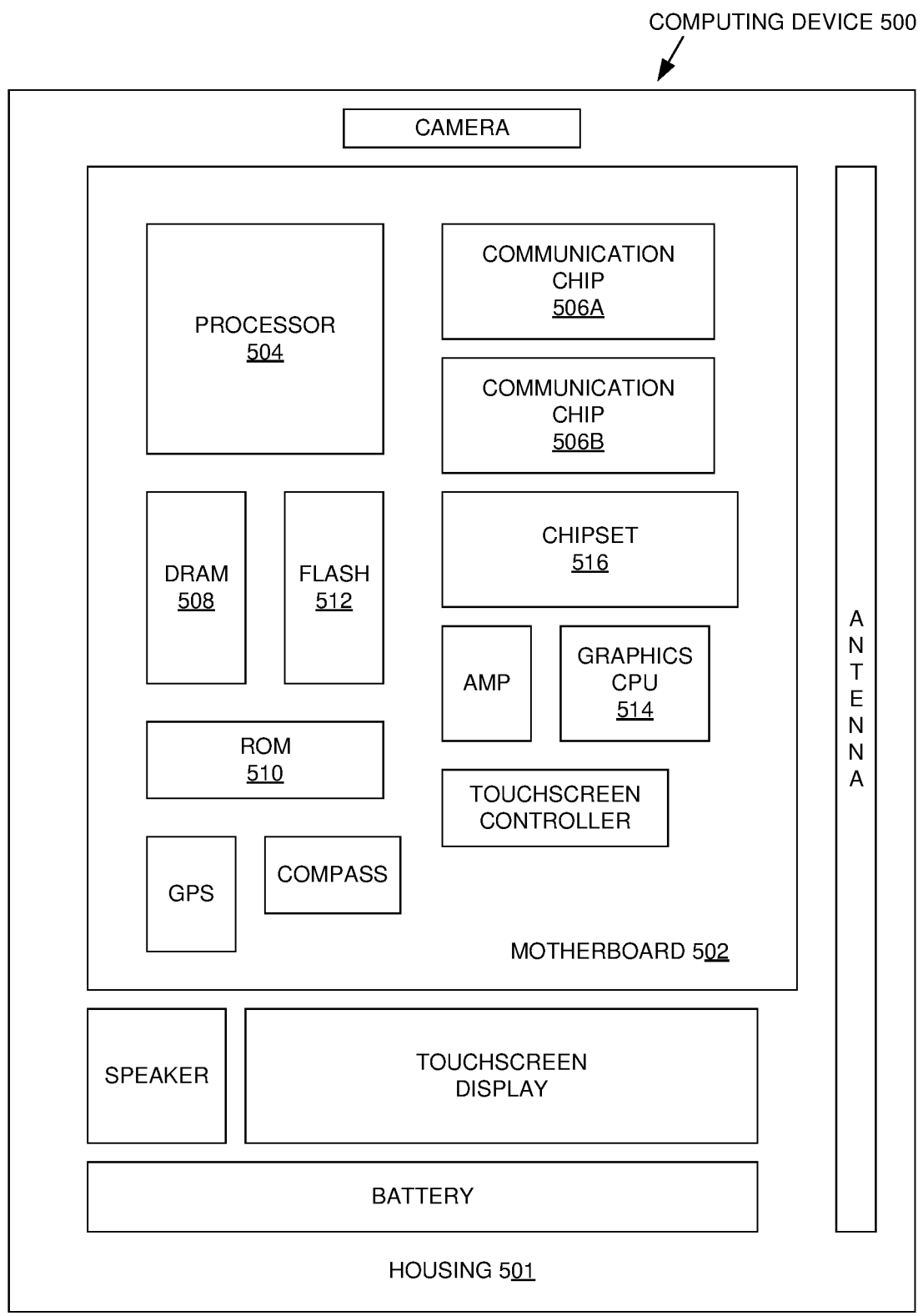
FIG. 5 is a functional block diagram of an electronic computing device, in accordance with some embodiments.

FIG. 5 illustrates an electronic or computing device 500 in accordance with one implementation of the present description. The computing device 500 may include a housing 501 having a motherboard 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the motherboard 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having a stacked die package structure, wherein the stacked die package structure may comprise a first die with one or more first die conductive structures and a first die dielectric material between individual ones of first die conductive structures. A second die and a third die may be directly on the one or more first die conductive structures. A first layer is on the first die in a die edge region and is on sidewalls of the first and second die. A second layer is on the first layer, the second layer comprising a fill material with a top surface substantially coplanar with the top surfaces of the second die and the third die.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-5. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is a microelectronic package structure comprising a first die comprising one or more first conductive structures and a first dielectric material between individual ones of the first conductive structures. A second die comprising one or more second conductive structures is directly on a first set of the one or more first conductive structures. A third die is adjacent to the second die, the third die comprising one or more third conductive structures directly on a second set of the one or more first conductive structures. A first layer on a sidewall of the second die, a sidewall of the third die, and on the first die conductive features in a region adjacent the second die sidewall or the third die sidewall. A second layer over the first layer, wherein the second layer comprises a surface that is substantially coplanar with top surfaces of the second die and the third die.

In second examples, the first example can optionally include wherein the first layer comprises wherein the first layer is directly on a corner region between the first die dielectric material and at least one of a second die sidewall or a third die sidewall.

In third examples, for any of the first examples the first layer comprises a diffusion barrier layer.

In fourth examples, for any of the first examples wherein a portion of the first layer is directly on an active region of the first die located adjacent a sidewall of the second die or the third die.

In fifth examples, wherein the fourth example can optionally include wherein the portion of the first layer comprise a step structure comprising a first portion on a sidewall of the first die dielectric material and a second portion directly on an active region of the first die, wherein about a 90 degree angle is between the first portion and the second portion.

In sixth examples, for any of the first examples wherein the second layer comprises a mold material.

In seventh examples, for any of the first examples wherein the first layer comprises one or more of alumina, silicon, oxygen, or nitrogen.

In eighth examples, for any of the first examples wherein the microelectronic package structure comprises a portion of a hybrid bond 3D stacked die package.

In ninth examples, for any of the first examples the first layer comprises a thickness between 50 nm to 100 nm.

In tenth examples, for any of the first examples wherein a third layer is on a surface of the second die and on a surface of the third die, wherein the third layer comprises gold, wherein the third layer is over the first layer.

In eleventh examples, a computer system comprising a power supply, one or more integrated circuit packages coupled to the power supply, wherein at least one of the integrated circuit packages further comprises a first die comprising one or more first conductive structures and a first dielectric material between individual ones of the first conductive structures. A second die comprising one or more second conductive structures directly on a first set of the one or more first conductive structures, a third die adjacent to the second die, the third die comprising one or more third conductive structures directly on a second set of the one or more first conductive structures, and a layer directly on the first die adjacent an edge of the first die, wherein the layer comprises a thickness of between 50 nm to 100 nm.

In twelfth examples, for any of the eleventh examples further comprising a fill layer directly on the layer, wherein the fill layer comprises a surface that is substantially coplanar with top surfaces of the first die and the second die.

In thirteenth examples, for any of the eleventh examples wherein the layer comprises a multilayer diffusion barrier, wherein a first diffusion layer comprises a thickness of 50 to 100 nm, and a second diffusion layer comprises a thickness of 50 to 150 nm.

In fourteenth examples, for any of the eleventh examples wherein the first diffusion layer comprises silicon and nitrogen, and the second diffusion layer comprises an alumina material.

In fifteenth examples, for any of the eleventh examples wherein a portion of the layer comprises a step structure comprising a first portion on the first die dielectric material and a second portion directly on an active region of the first die, wherein the first and second portions are located adjacent a sidewall of the second die or the third die.

In sixteenth examples, a method of fabricating an integrated circuit (IC) structure, comprises receiving a first die attached to a first region of a substrate and a second die attached to a second region of a substrate, forming a layer on sidewalls of the first die, the second die and on a surface of the substrate adjacent the first die and the second die, wherein the layer comprises a diffusion barrier, and forming a fill material on the layer, wherein the fill material comprises a surface that is substantially coplanar with top surfaces of the first die and the second die.

In seventeenth examples, for any of the sixteenth examples wherein forming the layer comprises forming a diffusion barrier material directly on a corner region between the first die dielectric material and on a sidewall of at least one of the first die or the second die.

In eighteenth examples, for any of the sixteenth examples wherein forming the layer comprises forming a material comprising at least one of silicon, nitrogen or alumina, wherein the layer comprises a thickness of less than 150 nm.

In nineteenth examples for any of the sixteenth examples wherein forming the layer comprises forming a diffusion barrier material over at least one of the substrate conductive features or an active region of the substrate, wherein the substrate conductive features and the active region of the substrate are located adjacent sidewalls of the first die or the second die.

In twentieth examples for any of the sixteenth examples wherein the forming the layer comprises forming the layer on a sidewall of a first die dielectric material and over an active region of the first die, wherein the first die dielectric material and the active region are located adjacent a sidewall of at least one of the first die or the second die.

In twenty first examples for any of the sixteenth examples wherein an approximately 90 degree angle is between the sidewall of the first die dielectric material and the active region.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A microelectronic package structure comprising:
a first die comprising one or more first conductive structures and a first die dielectric material between individual ones of the first conductive structures;
a second die comprising one or more second conductive structures directly on a first set of the one or more first conductive structures;
a third die adjacent to the second die, the third die comprising one or more third conductive structures directly on a second set of the one or more first conductive structures;
a first layer, wherein a first portion of the first layer is on a sidewall of the third die, and wherein a second portion of the first layer, adjacent the first portion of the first layer, is directly on the second set of the one or more first conductive structures, wherein about a 90 degree angle is between the first portion and the second portion, and wherein a third portion of the first layer adjacent to the second portion comprises a step structure, wherein a portion of the step structure is directly on an active region of the first die, wherein the active region comprises circuitry structures, and wherein the step structure comprises a first portion on a sidewall of the first die dielectric material and a second portion directly on the active region, wherein about a 90 degree angle is between the first portion and the second portion; and
a second layer over the first layer, wherein the second layer comprises a surface that is substantially coplanar with top surfaces of the second die and the third die.

2. The microelectronic package structure of claim 1, wherein the first layer comprises at least one of silicon carbide, silicon carbon nitride, copper, aluminum, or carbon.

3. The microelectronic package structure of claim 1, wherein the first layer comprises a diffusion barrier layer.

4. The microelectronic package structure of claim 1 wherein the first layer comprises one or more of alumina, silicon, oxygen, or nitrogen.

5. The microelectronic package structure of claim 1 wherein the second layer comprises a mold material.

6. The microelectronic package structure of claim 1 wherein the microelectronic package structure comprises a portion of a hybrid bond 3D stacked die package.

7. The microelectronic package structure of claim 1 wherein the first layer comprises a thickness between 50 nm to 100 nm.

8. The microelectronic package structure of claim 1 wherein a third layer is on a surface of the second die and on a surface of the third die, wherein the third layer comprises gold, wherein the third layer is over the first layer.

9. A computer system comprising;
a power supply;
one or more integrated circuit packages coupled to the power supply, wherein at least one of the integrated circuit packages further comprises:
a first die comprising one or more first conductive structures and a first die dielectric material between individual ones of the first conductive structures:
a second die comprising one or more second conductive structures directly on a first set of the one or more first conductive structures;
a third die adjacent to the second die, the third die comprising one or more third conductive structures directly on a second set of the one or more first conductive structures; and
a layer directly on the first die adjacent a sidewall of the second die, wherein the layer comprises a thickness of between 50 nm to 100 nm, and wherein a portion of the layer adjacent to the third die comprises a step structure, wherein a bottom portion of the step structure is directly on an active region of the first die, wherein the step structure comprises a first portion on a sidewall of the first die dielectric material and a second portion directly on the active region, wherein about a 90 degree angle is between the first portion and the second portion.

10. The computer system of claim 9, further comprising a fill layer directly on the layer, wherein the fill layer comprises a surface that is substantially coplanar with top surfaces of the first die and the second die.

11. The computer system of claim 9 wherein the layer comprises a multilayer diffusion barrier, wherein a first diffusion layer comprises a thickness of 50 to 100 nm, and a second diffusion layer comprises a thickness of 50 to 150 nm.

12. The computer system of claim 11 wherein the first diffusion layer comprises silicon and nitrogen, and the second diffusion layer comprises an alumina material.

13. The computer system of claim 9 wherein a first portion of the step structure is on a first die dielectric material sidewall, wherein the first portion and the bottom portion are above the active region.

14. A method of fabricating an integrated circuit (IC) package structure, the method comprising:
receiving a first die with a second die attached to a first region of the first die and a third die attached to a second region of the first die, wherein the first die comprises one or more first conductive structures and a first die dielectric material between individual ones of the first conductive structures;
forming a layer on sidewalls of the second die, on sidewalls of the third die and on the one or more first conductive structures at a surface of the first die between the second die and the third die, and directly on an active region of the first die adjacent to the third die, wherein the layer comprises a diffusion barrier, wherein a portion of the layer comprises a step structure, the step structure comprising a first portion on a sidewall of the first die dielectric material and a second portion directly on the active region, wherein about a 90 degree angle is between the first portion and the second portion; and
forming a fill material on the layer, wherein the fill material comprises a surface that is substantially coplanar with top surfaces of the second die and the third die.

15. The method of claim 14 wherein forming the layer comprises forming a diffusion barrier material directly on a corner region between the first die dielectric material and a sidewall of the third die.

16. The method of claim 14 wherein forming the layer comprises forming a material comprising at least one of silicon, nitrogen or alumina, wherein the layer comprises a thickness of less than 150 nm.

17. The method of claim 14 wherein forming the layer comprises forming a diffusion barrier material on a sidewall of the first die dielectric material and directly on the active region of the first die.

18. The method of claim 17 wherein an approximately 90 degree angle is between the sidewall of the first die dielectric material and the active region.

* * * * *